United States Patent
Mizuta

(10) Patent No.: US 7,746,252 B2
(45) Date of Patent: Jun. 29, 2010

(54) ANALOG FRONT-END CIRCUIT AND ELECTRONIC INSTRUMENT

(75) Inventor: Masahiko Mizuta, Sapporo (JP)

(73) Assignee: Seiko Epson Corporation (JP)

( * ) Notice: Subject to any disclaimer, the term of this patent is extended or adjusted under 35 U.S.C. 154(b) by 159 days.

(21) Appl. No.: 12/072,329

(22) Filed: Feb. 26, 2008

(65) Prior Publication Data
US 2008/0204297 A1    Aug. 28, 2008

(30) Foreign Application Priority Data
Feb. 27, 2007    (JP) .............................. 2007-046943

(51) Int. Cl.
*H03M 1/06* (2006.01)
(52) U.S. Cl. ...................... 341/118; 314/119; 314/120; 314/121; 314/139; 314/155; 348/222.1; 348/241; 348/308
(58) Field of Classification Search ......... 341/118–121, 341/132, 139, 142, 155; 348/222.1, 241, 348/308
See application file for complete search history.

(56) References Cited

U.S. PATENT DOCUMENTS

| | | | |
|---|---|---|---|
| 6,353,401 B1 * | 3/2002 | Aswell et al. ................ | 341/118 |
| 6,967,605 B2 | 11/2005 | Fujihara et al. | |
| 7,084,911 B1 * | 8/2006 | Lee et al. ..................... | 348/243 |
| 7,098,824 B2 * | 8/2006 | Yang et al. ................... | 341/131 |
| 7,280,091 B2 * | 10/2007 | Wang et al. ................... | 345/96 |
| 7,292,649 B2 * | 11/2007 | Atkinson et al. ............. | 375/316 |
| 7,301,487 B2 * | 11/2007 | Funakoshi et al. .......... | 341/122 |
| 7,345,613 B2 * | 3/2008 | Higuchi ...................... | 341/155 |
| 7,471,609 B2 * | 12/2008 | Tateishi et al. ............. | 369/103 |
| 2003/0202111 A1 * | 10/2003 | Park .......................... | 348/243 |
| 2006/0077852 A1 * | 4/2006 | Tateishi et al. ............. | 369/103 |
| 2007/0127046 A1 * | 6/2007 | Soeda ........................ | 358/1.9 |
| 2008/0001802 A1 * | 1/2008 | Higuchi ...................... | 341/155 |
| 2008/0014895 A1 * | 1/2008 | Li et al. ..................... | 455/324 |
| 2008/0084337 A1 * | 4/2008 | Batruni ....................... | 341/118 |

FOREIGN PATENT DOCUMENTS

| | | |
|---|---|---|
| JP | 2004-297146 | 10/2004 |
| JP | 2005-51565 | 2/2005 |

* cited by examiner

*Primary Examiner*—Linh V Nguyen
(74) *Attorney, Agent, or Firm*—Harness, Dickey & Pierce, P.L.C.

(57) ABSTRACT

An analog front-end circuit includes an analog processing circuit, an A/D converter, a target register in which a lower limit target value of an input image signal is set, and a calculation circuit. The analog processing circuit includes an offset control circuit which performs offset control based on an offset control value set in an offset control register. The calculation circuit monitors the A/D-converted value in a lower limit value output period when the A/D-converted value corresponding to a lower limit value of an input range is output from the A/D converter, and sets the offset control value that causes the A/D-converted value to become closer to the lower limit target value set in the target register in the offset control register.

20 Claims, 21 Drawing Sheets

FIG. 8A

| PROCESS-ING LINE | COUNT VALUE m | A/D-CONVERTED VALUE (AVERAGE VALUE) | OFFSET CONTROL VALUE | |
|---|---|---|---|---|
| | | | DURING ANALYSIS | AFTER ANALYSIS |
| 1 | 10 | 0x020 | 10_0000_0000 | 10_0000_0000 |
| 2 | 9 | 0x045 | 11_0000_0000 | 10_0000_0000 |
| 3 | 8 | 0x035 | 10_1000_0000 | 10_1000_0000 |
| : | : | : | : | : |
| 10 | 1 | 0x041 | 10_1xxx_xxx1 | 10_1xxx_xxx0 |

FIG. 8B

| PROCESS-ING LINE | COUNT VALUE i | A/D-CONVERTED VALUE (AVERAGE VALUE) | GAIN CONTROL VALUE | |
|---|---|---|---|---|
| | | | DURING ANALYSIS | AFTER ANALYSIS |
| 1 | 8 | 0x3FF | 1000_0000 | 0000_0000 |
| 2 | 7 | 0x310 | 0100_0000 | 0100_0000 |
| 3 | 6 | 0x3E0 | 0110_0000 | 0100_0000 |
| : | : | : | : | : |
| 8 | 1 | 0x3C1 | 010x_xxx1 | 010x_xxx0 |

FIG. 9

| TYPE OF PROCESS | LINE | OFFSET CONTROL VALUE | GAIN CONTROL VALUE |
|---|---|---|---|
| OFFSET SETTING PROCESS | 1~11 | CONTROL | INITIAL VALUE |
| NOT CONTROL (DUMMY) | 12 | ↓ | |
| GAIN SETTING PROCESS | 13~21 | CONTROLLED VALUE | CONTROL |
| NOT CONTROL (DUMMY) | 22 | | ↓ |
| OFFSET SETTING PROCESS | 23~33 | CONTROL | CONTROLLED VALUE |
| NOT CONTROL (DUMMY) | 34 | ↓ | |
| GAIN SETTING PROCESS | 35~43 | CONTROLLED VALUE | CONTROL |

FIG. 12

| ADDRESS | WHPIX 15 | OBPIX 14 | SNCKCTL[1:0] 13~12 | SHX 11 | SH5 10 | SH4 9 | SH3 8 | SH2 7 | SH1 6 | SH6 5 | LINEMD 4 | PIXNUM[19:16] 3~0 | PIXNUM[15:0] 15~0 |
|---|---|---|---|---|---|---|---|---|---|---|---|---|---|
| 0x00 | 0 | 0 | 00 | 0 | 0 | 0 | 0 | 0 | 0 | 0 | 0 | 0x00000 | |
| 0x02 | 0 | 0 | 11 | 0 | 1 | 0 | 0 | 0 | 0 | 0 | 0 | 0x00001 | |
| 0x04 | 0 | 1 | 01 | 0 | 0 | 0 | 0 | 0 | 1 | 0 | 0 | 0x00002 | |
| 0x06 | 0 | 1 | 10 | 0 | 0 | 1 | 0 | 0 | 1 | 0 | 0 | 0x00003 | |
| 0x08 | 0 | 0 | 00 | 1 | 0 | 0 | 0 | 1 | 0 | 0 | 0 | 0x00004 | |
| 0x0A | 1 | 0 | 01 | 0 | 0 | 1 | 0 | 1 | 1 | 0 | 0 | 0x00005 | |
| 0x0C | 0 | 0 | 00 | 0 | 1 | 0 | 1 | 0 | 1 | 0 | 0 | 0x00006 | |
| 0x0E | 1 | 0 | 00 | 0 | 0 | 0 | 1 | 1 | 0 | 0 | 0 | 0x00007 | |
| 0x10 | 0 | 0 | 11 | 1 | 0 | 0 | 0 | 1 | 0 | 0 | 0 | 0x00008 | |
| 0x12 | 0 | 0 | 11 | 0 | 0 | 0 | 1 | 0 | 0 | 0 | 0 | 0x00009 | |
| 0x14 | 0 | 0 | 10 | 0 | 0 | 0 | 1 | 0 | 0 | 0 | 0 | 0x0000A | |
| 0x16 | 1 | 1 | 11 | 1 | 1 | 1 | 1 | 1 | 1 | 1 | 1 | 0xFFFFF | |
| 0x18 | 1 | 1 | 11 | 1 | 1 | 1 | 1 | 1 | 1 | 1 | 1 | 0xFFFFF | |
| 0x1A | 1 | 1 | 11 | 1 | 1 | 1 | 1 | 1 | 1 | 1 | 1 | 0xFFFFF | |
| 0x1C | 1 | 1 | 11 | 1 | 1 | 1 | 1 | 1 | 1 | 1 | 1 | 0xFFFFF | |
| 0x1E | 1 | 1 | 11 | 1 | 1 | 1 | 1 | 1 | 1 | 1 | 1 | 0xFFFFF | |
| 0x20 | 1 | 1 | 11 | 1 | 1 | 1 | 1 | 1 | 1 | 1 | 1 | 0xFFFFF | |
| 0x22 | 1 | 1 | 11 | 1 | 1 | 1 | 1 | 1 | 1 | 1 | 1 | 0xFFFFF | |
| 0x24 | 1 | 1 | 11 | 1 | 1 | 1 | 1 | 1 | 1 | 1 | 1 | 0xFFFFF | |
| 0x26 | 1 | 1 | 11 | 1 | 1 | 1 | 1 | 1 | 1 | 1 | 1 | 0xFFFFF | |
| 0x28 | 1 | 1 | 11 | 1 | 1 | 1 | 1 | 1 | 1 | 1 | 1 | 0xFFFFF | |
| 0x2A | 1 | 1 | 11 | 1 | 1 | 1 | 1 | 1 | 1 | 1 | 1 | 0xFFFFF | |
| 0x2C | 1 | 1 | 11 | 1 | 1 | 1 | 1 | 1 | 1 | 1 | 1 | 0xFFFFF | |
| 0x2E | 1 | 1 | 11 | 1 | 1 | 1 | 1 | 1 | 1 | 1 | 1 | 0xFFFFF | |
| 0x30 | 1 | 1 | 11 | 1 | 1 | 1 | 1 | 1 | 1 | 1 | 1 | 0xFFFFF | |
| 0x32 | 1 | 1 | 11 | 1 | 1 | 1 | 1 | 1 | 1 | 1 | 1 | 0xFFFFF | |
| 0x34 | 1 | 1 | 11 | 1 | 1 | 1 | 1 | 1 | 1 | 1 | 1 | 0xFFFFF | |
| 0x36 | 1 | 1 | 11 | 1 | 1 | 1 | 1 | 1 | 1 | 1 | 1 | 0xFFFFF | |
| ⋮ | | | | | | | | | | | | ⋮ | |
| 0x7C | 1 | 1 | 11 | 1 | 1 | 1 | 1 | 1 | 1 | 1 | 1 | 0xFFFFF | |
| 0x7E | 1 | 1 | 11 | 1 | 1 | 1 | 1 | 1 | 1 | 1 | 1 | 0xFFFFF | |

| BIT | SYMBOL | | DEFINITION |
|---|---|---|---|
| | LINE SEQUENTIAL MODE | DOT SEQUENTIAL MODE | |
| 0~15 | PIXNUM[19:0] | PIXNUM[19:0] | PIXEL NUMBER AT WHICH CHANGE EVENT OCCURS (COMPARED WITH PIXEL COUNT VALUE) |
| 0~3 | | | |
| 4 | LINEMD[1:0] | LINEMD | LINE AT WHICH CHANGE EVENT OCCURS (COMPARED WITH LINE COUNT VALUE) |
| 5 | | SH6 | SIGNAL SH6 |
| 6 | SH1 | SH1 | SIGNAL SH1 |
| 7 | SH2 | SH2 | SIGNAL SH2 |
| 8 | SH3 | SH3 | SIGNAL SH3 |
| 9 | SH4 | SH4 | SIGNAL SH4 |
| 10 | SH5 | SH5 | SIGNAL SH5 |
| 11 | SHX | SHX | SIGNAL SHX |
| 12~13 | SNCKCTL[1:0] | SNCKCTL[1:0] | CLOCK CONTROL SIGNAL 00: (NO CHANGE) 01: OUTPUT PATTERN 1 10: OUTPUT PATTERN 2 11: FIXED VALUE OUTPUT, FIXED VALUE OUTPUT SWITCHING |
| 14 | OBPIX | OBPIX | BLACK REFERENCE PIXEL POSITION INDICATION SIGNAL |
| 15 | WHPIX | WHPIX | WHITE PIXEL POSITION INDICATION SIGNAL |

FIG. 16

| ADDRESS | 15 | 14 | CK2 13 | CK1 12 | 11 | SNCK4 10 | SNCK3 9 | SNCK2 8 | 7 | SNCK1D 6 | 5 | SNCK1C 4 | 3 | SNCK1B 2 | 1 | SNCK1A 0 | INTERNAL STATE |
|---|---|---|---|---|---|---|---|---|---|---|---|---|---|---|---|---|---|
| 0x00 | — | — | 0 | 1 | — | 0 | 1 | 0 | — | 1 | — | 1 | — | 1 | — | 1 | 0 |
| 0x01 | — | — | 0 | 1 | — | 0 | 1 | 1 | — | 1 | — | 1 | — | 1 | — | 1 | 1 |
| 0x02 | — | — | 0 | 1 | — | 0 | 1 | 1 | — | 1 | — | 1 | — | 1 | — | 1 | 2 |
| 0x03 | — | — | 0 | 1 | — | 0 | 1 | 0 | — | 1 | — | 1 | — | 1 | — | 1 | 3 |
| 0x04 | — | — | 0 | 1 | — | 0 | 1 | 0 | — | 1 | — | 1 | — | 1 | — | 1 | 4 |
| 0x05 | — | — | 0 | 1 | — | 0 | 1 | 0 | — | 1 | — | 0 | — | 0 | — | 0 | 5 |
| 0x06 | — | — | 0 | 1 | — | 0 | 1 | 0 | — | 1 | — | 0 | — | 0 | — | 0 | 6 |
| 0x07 | — | — | 0 | 1 | — | 0 | 1 | 0 | — | 1 | — | 0 | — | 1 | — | 0 | 7 |
| 0x08 | — | — | 0 | 1 | — | 0 | 1 | 0 | — | 1 | — | 1 | — | 1 | — | 0 | 8 |
| 0x09 | — | — | 0 | 0 | — | 0 | 1 | 0 | — | 0 | — | 1 | — | 1 | — | 0 | 9 |
| 0x0A | — | — | 0 | 0 | — | 0 | 1 | 0 | — | 1 | — | 1 | — | 1 | — | 0 | 10 |
| 0x0B | — | — | 0 | 0 | — | 0 | 1 | 0 | — | 1 | — | 1 | — | 1 | — | 0 | 11 |
| 0x0C | — | — | 1 | 0 | — | 0 | 1 | 0 | — | 1 | — | 1 | — | 1 | — | 0 | 12 |
| 0x0D | — | — | 1 | 0 | — | 0 | 1 | 0 | — | 1 | — | 1 | — | 1 | — | 0 | 13 |
| 0x0E | — | — | 1 | 0 | — | 0 | 1 | 0 | — | 1 | — | 1 | — | 1 | — | 0 | 14 |
| 0x0F | — | — | 1 | 0 | — | 0 | 1 | 0 | — | 1 | — | 1 | — | 1 | — | 0 | 15 |

ANALOG FRONT-END CIRCUIT AND ELECTRONIC INSTRUMENT

Japanese Patent Application No. 2007-46943 filed on Feb. 27, 2007, is hereby incorporated by reference in its entirety.

BACKGROUND OF THE INVENTION

The present invention relates to an analog front-end circuit, an electronic instrument, and the like.

In an image sensor such as a CCD or CMOS sensor used for electronic instruments such as an image reader, an analog image signal relating to a document or the like read by the image sensor is converted into a digital image data using an A/D converter. JP-A-2004-297146 discloses technology relating to an analog front-end circuit (image processor) having such an A/D converter.

As a method which controls the offset or the gain of such an analog front-end circuit, an external CPU (firmware which operates on a CPU) may set an offset control value or a gain control value in a register before scanning a document to implement offset control or gain control.

According to this method, since a closed-loop feedback occurs within the image sensor (line sensor), the analog front-end circuit, and the CPU, it takes time to prepare to read a document. Moreover, since firmware which operates on the CPU is required, it is necessary to construct an analysis algorithm or analysis means.

SUMMARY

According to one aspect of the invention, there is provided an analog front-end circuit comprising:

an analog processing circuit that receives an input image signal from an image sensor, performs a given process on the input image signal, and outputs an image signal;

an A/D converter that A/D-converts the image signal input from the analog processing circuit;

a target register, a lower limit target value of an input range of the image signal input from the analog processing circuit to the A/D converter being set in the target register; and a calculation circuit that monitors an A/D-converted value output from the A/D converter and performs a calculation process, the analog processing circuit including an offset control circuit that includes an offset control register and performs offset control on the input image signal to output the image signal based on an offset control value set in the offset control register; and the calculation circuit monitoring the A/D-converted value in a lower limit value output period when the A/D-converted value corresponding to a lower limit value of the input range is output from the A/D converter, and performing an offset setting process that sets the offset control value in the offset control register, the offset control value causing the A/D-converted value to become closer to the lower limit target value set in the target register.

According to another aspect of the invention, there is provided an analog front-end circuit comprising:

an analog processing circuit that receives an input image signal from an image sensor, performs a given process on the input image signal, and outputs an image signal;

an A/D converter that A/D-converts the image signal input from the analog processing circuit;

a target register, an upper limit target value of an input range of the image signal input from the analog processing circuit to the A/D converter being set in the target register; and a calculation circuit that monitors an A/D-converted value output from the A/D converter and performs a calculation process, the analog processing circuit including a gain control circuit that includes a gain control register and performs gain control on the input image signal to output the image signal based on a gain control value set in the gain control register; and the calculation circuit monitoring the A/D-converted value in an upper limit value output period when the A/D-converted value corresponding to an upper limit value of the input range is output from the A/D converter, and performing a gain setting process that sets the gain control value in the gain control register, the gain control value causing the A/D-converted value to become closer to the upper limit target value set in the target register.

According to another aspect of the invention, there is provided an electronic instrument comprising:

one of the above analog front-end circuits; and
an image sensor.

BRIEF DESCRIPTION OF THE SEVERAL VIEWS OF THE DRAWING

FIGS. 8A and 8B are views illustrative of a specific operation according to one embodiment of the invention.

FIG. 9 is a view illustrative of a method which repeats an offset setting process and a gain setting process a plurality of times.

FIG. 12 is a view illustrative of the memory space of an event information memory.

FIG. 13 is a view illustrative of each bit of an event information memory.

FIG. 16 is a view illustrative of a drive clock signal pattern memory.

DETAILED DESCRIPTION OF THE EMBODIMENT

Figure 1A:
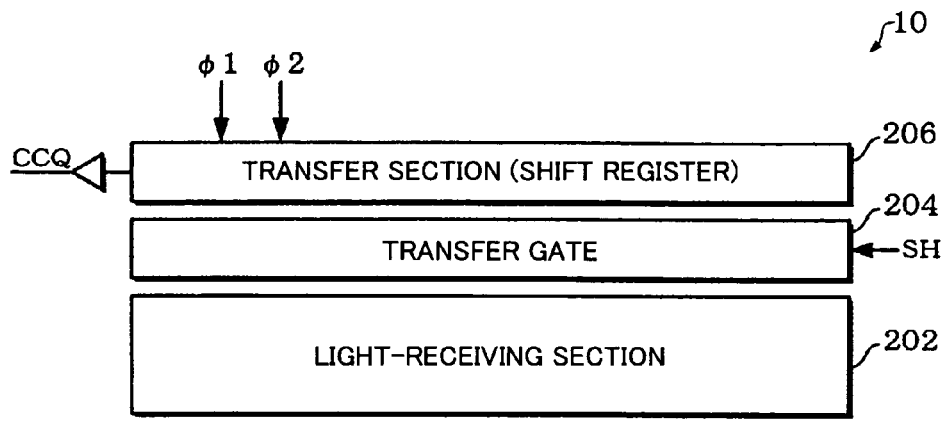
FIGS. 1A to 1C are views illustrative of an image sensor.

Some aspects of the invention may provide an analog front-end circuit which can complete offset control or gain control in a short period of time and can effectively utilize the conversion range of an A/D converter, and an electronic instrument including the same.

According to one embodiment of the invention, there is provided an analog front-end circuit comprising:

an analog processing circuit that receives an input image signal from an image sensor, performs a given process on the input image signal, and outputs an image signal;

an A/D converter that A/D-converts the image signal input from the analog processing circuit;

a target register, a lower limit target value of an input range of the image signal input from the analog processing circuit to the A/D converter being set in the target register; and a calculation circuit that monitors an A/D-converted value output from the A/D converter and performs a calculation process, the analog processing circuit including an offset control circuit that includes an offset control register and performs offset control on the input image signal to output the image signal based on an offset control value set in the offset control register; and the calculation circuit monitoring the A/D-converted value in a lower limit value output period when the A/D-converted value corresponding to a lower limit value of the input range is output from the A/D converter, and performing an offset setting process that sets the offset control value in the offset control register, the offset control value causing the A/D-converted value to become closer to the lower limit target value set in the target register.

According to this embodiment, the lower limit target value of the input range of the A/D converter is set in the target register. The A/D-converted value is monitored in the lower limit value output period, and the offset control value which causes the A/D-converted value to become closer to the lower limit target value is set in the offset control register. This enables offset control to be automatically completed in a short period of time, whereby convenience can be improved. Moreover, since the A/D-converted value in the lower limit value output period approaches the lower limit target value set in the target register due to the offset setting process, the conversion range of the A/D converter can be effectively utilized.

In the analog front-end circuit, the calculation circuit may perform a comparison process, a bit determination process, and a decrement process until m becomes 0 from n (n≧m≧0; n and m are integer numbers), the comparison process setting 1 in bit m−1 of the offset control value set in the offset control register that has an n-bit width and comparing the A/D-converted value with the lower limit target value, the bit determination process determining a logic level of the bit m−1 of the offset control value to be 1 when the A/D-converted value is smaller than the lower limit target value and determining the logic level of the bit m−1 of the offset control value to be 0 when the A/D-converted value is larger than the lower limit target value, and the decrement process decrementing m by one.

This implements the offset setting process which causes the A/D-converted value to become closer to and coincide with the lower limit target value by merely providing a circuit which performs the comparison process between the A/D-converted value and the lower limit target value, the bit determination process, and the like.

In the analog front-end circuit, the calculation circuit may again monitor the A/D-converted value output from the A/D converter after m has become 0 and the logic levels of all bits of the offset control value set in the offset control register have been determined, and may add 1 to the offset control value set in the offset control register when the A/D-converted value that has been monitored is less than the lower limit target value.

This prevents a situation in which the lower limit value of the input image signal input to the A/D converter becomes smaller than the lower limit target value so that the input image signal falls outside the A/D conversion range.

In the analog front-end circuit, the calculation circuit may include an averaging circuit that averages the A/D-converted values output from the A/D converter, and may compare an average A/D-converted value of a plurality of pixels with the lower limit target value.

This maintains the accuracy of the offset setting process even if the A/D-converted value changes due to noise or the like.

The analog front-end circuit may further include:

a monitor register, a monitor value of the A/D-converted value output from the A/ID converter being set in the monitor register; and an external interface that allows external access to the target register and the monitor register.

According to this configuration, since the A/D-converted value can be monitored externally, it is possible to externally check whether or not an appropriate lower limit value has been set, whereby convenience can be improved.

In the analog front-end circuit, the lower limit value output period may be a black reference pixel output period, the A/D-converted value of a black reference pixel of the image sensor being output in the black reference pixel output period.

This makes it possible to monitor the A/D-converted value corresponding to the lower limit value effectively utilizing the black reference pixel.

In the analog front-end circuit, the analog front-end circuit may further include a timing generator that generates a plurality of control signals that are supplied to the image sensor, the timing generator may output a black reference pixel indication signal that designates the black reference pixel output period as a control signal among the plurality of control signals; and the calculation circuit may monitor the A/D-converted value output from the A/D converter when the black reference pixel indication signal has become active, and may compare the A/D-converted value with the lower limit target value.

This enables the black reference pixel indication signal to be automatically generated by the timing generator in the analog front-end circuit so that offset control can be automatically performed.

In the analog front-end circuit, the timing generator may include:

an event information memory; and a control signal output circuit that generates the plurality of control signals based on information read from the event information memory, and outputs the plurality of control signals that have been generated;

the event information memory may store a pixel number and change event occurrence information at each address, the change event occurrence information specifying a control signal among the plurality of control signals that undergoes a signal level change event at the pixel number; and the control signal output circuit may generate the plurality of control signals based on the pixel number and the change event occurrence information read from the event information memory, and may output the plurality of control signals that have been generated.

According to this embodiment, the pixel number and the change event occurrence information are stored at each address of the event information memory while being associated with each other. A control signal that undergoes the signal level change event at the pixel number is specified by the change event occurrence information, and the control signals for the image sensor are generated based on the change event occurrence information and the pixel number. Therefore, even if the change event relating to the signal level of the control signal occurs frequently, the control signals can be efficiently generated by generating the control signals using the event information memory.

In the analog front-end circuit, the pixel number may be allocated to bit 0 to bit L of data stored at each address of the event information memory, and the change event occurrence information may be allocated to bit L+1 to bit M (L<M; L and M are natural numbers) of the data stored at each address of the event information memory.

According to this configuration, the pixel number and the change event occurrence information can be easily associated.

In the analog front-end circuit, first to (M−L)th control signals among the plurality of control signals may be respectively allocated to the bit L+1 to the bit M of the event information memory.

According to this configuration, the change event occurrence information relating to the plurality of control signals can be set using the (L+1)th to Mth bits of the data at each address.

In the analog front-end circuit, the control signal output circuit may sequentially read the pixel number and the change event occurrence information in an order from a head address to an end address of the event information memory, and may return a read pointer of the event information memory to the head address before the end address is reached when at least one of the pixel number and the change event occurrence information that have been read is set to finish indication information that indicates that the change event has finished.

This prevents a situation in which the pixel number and the change event occurrence information are unnecessarily read even if a change event does not occur, whereby the process efficiency can be increased.

In the analog front-end circuit, an upper limit target value of the input range of the image signal input from the analog processing circuit to the A/D converter may be set in the target register;

the analog processing circuit may include a gain control circuit that includes a gain control register and performs gain control on the input image signal to output the image signal based on a gain control value set in the gain control register; and the calculation circuit may monitor the A/D-converted value in an upper limit value output period when the A/D-converted value corresponding to an upper limit value of the input range is output from the A/D converter, and may perform a gain setting process that sets the gain control value in the gain control register, the gain control value causing the A/D-converted value to become closer to the upper limit target value set in the target register.

This enables gain control to be automatically completed in a short period of time, whereby convenience can be improved. Moreover, since the A/D-converted value in the upper limit value output period approaches the upper limit target value set in the target register due to the gain setting process, the conversion range of the A/D converter can be effectively utilized.

In the analog front-end circuit, the calculation circuit may perform the offset setting process using image signals of pixels in Gth to Hth (G<H; G and H are natural numbers) lines of the image sensor, and then may perform the gain setting process using image signals of pixels in Ith to Jth (I<J; I and J are natural numbers) lines of the image sensor.

This allows gain control to be performed taking the offset control results into consideration, whereby the accuracy of coincidence between the A/D-converted value and the upper limit target value can be increased.

In the analog front-end circuit, the calculation circuit may repeat a setting process that includes the offset setting process and the gain setting process a plurality of times.

This further increases the accuracy of the offset setting process and the gain setting process.

In the analog front-end circuit, the calculation circuit may perform the offset setting process using the image signals of the pixels in the Gth to Hth lines, may omit the offset setting process and the gain setting process for a line between the Hth line and the Ith line, and then may perform the gain setting process using the image signals of the pixels in the Ith to Jth lines.

This enables the operation of the analog processing circuit and the A/D converter can be stabilized before gain control, whereby the process accuracy can be improved.

According to another embodiment of the invention, there is provided an analog front-end circuit comprising:

an analog processing circuit that receives an input image signal from an image sensor, performs a given process on the input image signal, and outputs an image signal;

an A/D converter that A/D-converts the image signal input from the analog processing circuit;

a target register, an upper limit target value of an input range of the image signal input from the analog processing circuit to the A/D converter being set in the target register; and a calculation circuit that monitors an A/D-converted value output from the A/D converter and performs a calculation process, the analog processing circuit including a gain control circuit that includes a gain control register and performs gain control on the input image signal to output the image signal based on a gain control value set in the gain control register; and the calculation circuit monitoring the A/D-converted value in an upper limit value output period when the A/D-converted value corresponding to an upper limit value of the input range is output from the A/D converter, and performing a gain setting process that sets the gain control value in the gain control register, the gain control value causing the A/D-converted value to become closer to the upper limit target value set in the target register.

According to this embodiment, the upper limit target value of the input range of the A/D converter is set in the target register. The A/D-converted value is monitored in the upper limit value output period, and the gain control value which causes the A/D-converted value to become closer to the upper limit target value is set in the gain control register. This enables gain control to be automatically completed in a short period of time, whereby convenience can be improved. Moreover, since the A/D-converted value in the upper limit value output period approaches the upper limit target value set in the target register due to the gain setting process, the conversion range of the A/D converter can be effectively utilized.

In the analog front-end circuit, the calculation circuit may perform a comparison process, a bit determination process, and a decrement process until i becomes 0 from j ($j \geq i \geq 0$; i and j are integer numbers, the comparison process, setting 1 in bit i−1 ($0 \geq i \geq 0$) of the gain control value set in the gain control register that has a j-bit width and comparing the A/D-converted value with the upper limit target value, the bit determination process determining a logic level of the bit i−1 of the gain control value to be 1 when the A/D-converted value is smaller than the upper limit target value and determining the logic level of the bit i−1 of the gain control value to be 0 when the A/D-converted value is larger than the upper limit target value, and the decrement process decrementing i by one.

This implements the gain setting process which causes the A/D-converted value to become closer to and coincide with the upper limit target value by merely providing a circuit which performs the comparison process between the A/D-converted value and the upper limit target value, the bit determination process, and the like.

In the analog front-end circuit, the calculation circuit may again monitor the A/D-converted value output from the A/D converter after i has become 0 and the logic levels of all bits of the gain control value set in the gain control register have been determined, and may subtract 1 from the gain control value set in the gain control register when the A/D-converted value that has been monitored is larger than the upper limit target value.

This prevents a situation in which the upper limit value of the input image signal input to the A/D converter becomes larger than the upper limit target value so that the input image signal falls outside the A/D conversion range.

In the analog front-end circuit, the upper limit value output period may be a white pixel output period, the A/D-converted value of a white pixel of the image sensor being output in the white pixel output period.

This makes it possible to monitor the A/D-converted value corresponding to the upper limit value effectively utilizing the white pixel.

The analog front-end circuit may further include a timing generator that generates a plurality of control signals that are supplied to the image sensor, the timing generator may output a white pixel indication signal that designates the white pixel output period as one of the plurality of control signals; and the calculation circuit may monitor the A/D-converted value output from the A/D converter when the white pixel indication signal has become active, and may compare the A/D-converted value with the upper limit target value.

This enables the white pixel indication signal to be automatically generated by the timing generator in the analog front-end circuit so that gain control can be automatically performed.

According to another embodiment of the invention, there is provided an electronic instrument comprising:

one of the above analog front-end circuits; and an image sensor.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. Image Sensor

FIG. 1A shows a configuration example of an image sensor 10. The image sensor 10 (e.g., CCD line sensor) includes a light-receiving section 202, a transfer gate 204, and a transfer section 206 (shift register). The light-receiving section 202 includes a plurality of light-receiving elements (photodiodes or pixels) which perform photoelectric conversion.

Each light-receiving element (pixel) of the light-receiving section 202 produces and stores a charge corresponding to the amount of received light. A shift signal SH becomes active after a specific period of time required for charge storage has expired so that the transfer gate 204 is turned ON. As a result, the stored charge is transferred to a shift register (shift register provided corresponding to each light-receiving element) of the transfer section 206 through the transfer gate 204. The stored charge (image signal) transferred to each shift register is transferred to the adjacent shift registers based on two-phase drive clock signals $\phi 1$ and $\phi 2$. This causes an image signal corresponding to the charge stored in each light-receiving element to be serially output from a CCQ terminal of the image sensor 10.

Figure 1B:
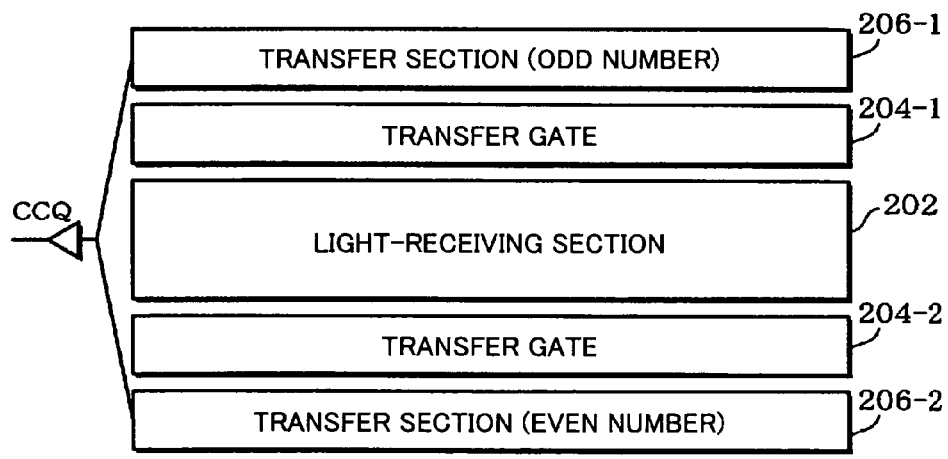
Figure 1C:
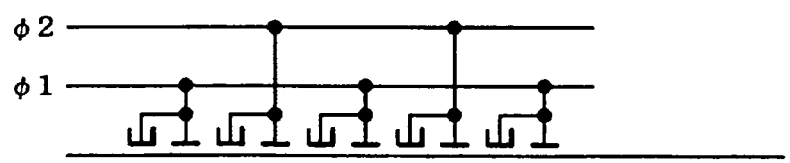

Note that the configuration of the image sensor 10 is not limited to the configuration shown in FIG. 1A. Various modifications and variations may be made. As shown in FIG. 1B, it is desirable to provide a transfer gate 204-1 and a transfer section 206-1 for odd-numbered pixels and a transfer gate 204-2 and a transfer section 206-2 for even-numbered pixels, for example. In the configurations shown in FIGS. 1A and 1B, it is desirable to provide light-receiving sections, transfer gates, and transfer sections for reading an R (red), G (green), and B (blue) image. FIG. 1C shows a configuration example of the shift register of the transfer section 206.

2. Configuration of Analog Front-End Circuit

Figure 2:
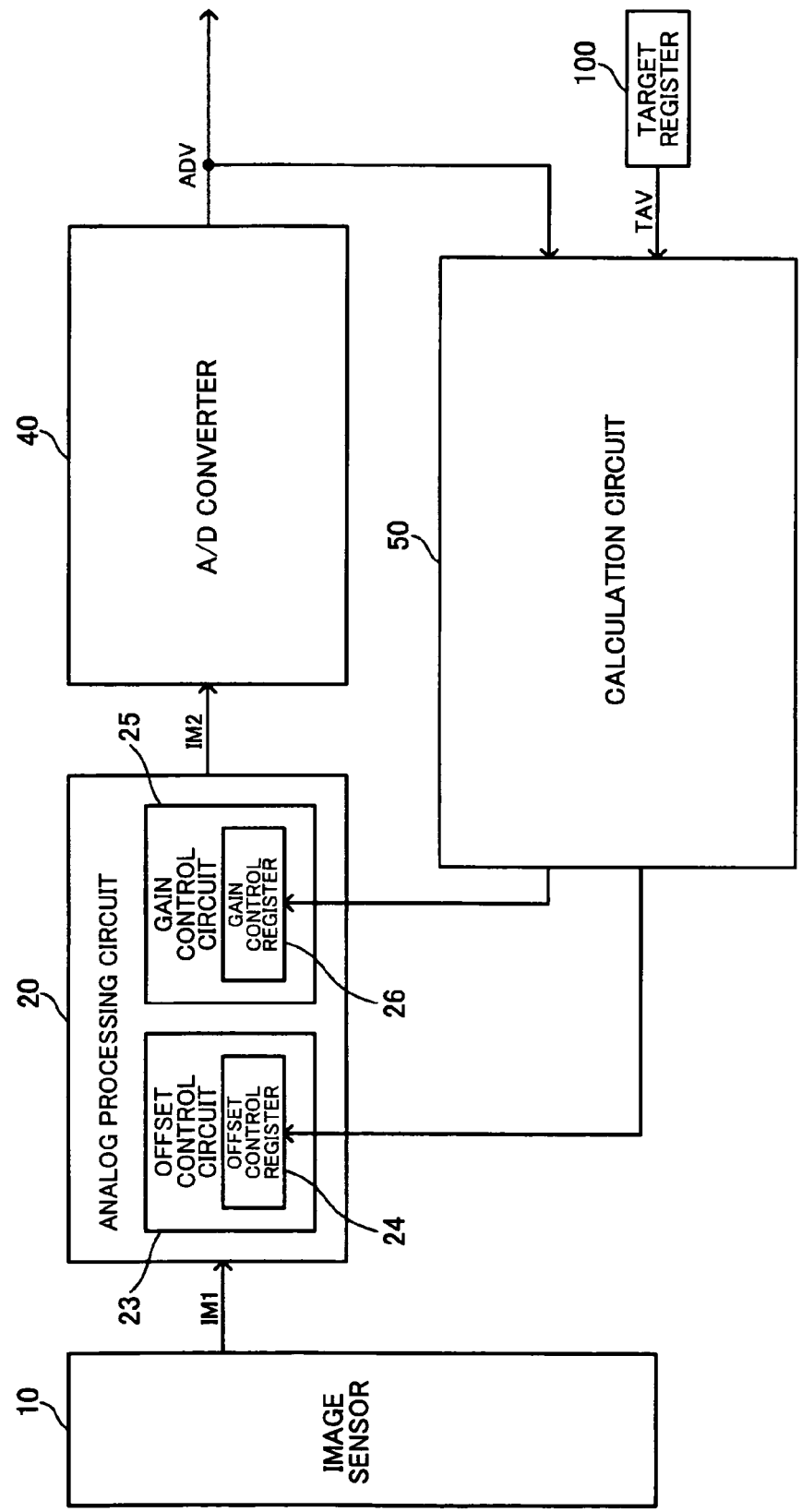
FIG. 2 shows a configuration example of an analog front-end circuit according to one embodiment of the invention.

FIG. 2 shows a configuration example of an analog front-end circuit (image processor or image processing controller) according to this embodiment. This analog front-end circuit (AFE) includes an analog processing circuit 20 and an A/D converter 40. Note that the analog front-end circuit according to this embodiment is not limited to the configuration shown in FIG. 2. Various modifications may be made such as omitting some elements (e.g., offset control circuit or gain control circuit) or adding other elements (e.g., timing generator, external interface, image data transmission circuit, or PLL circuit).

The analog processing circuit 20 (analog signal processing circuit) receives an analog input image signal IM1 from the image sensor 10 (line sensor) such as a CCD. The analog processing circuit 20 performs a given process (preprocess before A/D conversion) on the input image signal IM1, and outputs an analog image signal IM2. Specifically, the analog processing circuit 20 performs offset control or gain control on the image signal IM1 as the given process, for example. Or, the analog processing circuit 20 performs a clamping process which sets the image signal IM1 at a given clamping level, a correlated double sampling (CDS) process, an image signal sampling process, or the like.

The analog processing circuit 20 includes an offset control circuit 23 and a gain control circuit 25. Note that the offset control circuit 23 or the gain control circuit 25 may be omitted.

The offset control circuit 23 includes an offset control register 24. The offset control circuit 23 performs offset control on the image signal based on an offset control value set in the offset control register 24. The gain control circuit 25 includes a gain control register 26. The gain control circuit 25 performs gain control on the image signal based on a gain control value set in the gain control register 26. For example, the gain control circuit 25 performs gain control on the image signal subjected to offset control. When the image sensor 10 outputs a color image signal, R, G, and B offset control values may be set in the offset control circuit 23, and R, G, and B gain control values may be set in the gain control circuit 25, for example.

The A/D converter 40 subjects the image signal IM2 output from the analog processing circuit 20 to A/D conversion. The A/D converter 40 outputs an A/D-converted value ADV (digital image data). As the A/D converter 40, a pipeline A/D converter having a plurality of cascaded pipeline stages may be used, for example. Each pipeline stage of the pipeline A/D converter quantizes the input image signal using a sub-A/D converter to convert the input image signal into digital data, and D/A-converts the digital data using a sub-D/A converter. Each pipeline stage subjects the input image signal and the analog signal obtained using the sub-D/A converter to a subtraction process, amplifies the resulting signal, and outputs the amplified signal to the subsequent pipeline stage. The A/D converter 40 is not limited to the pipeline A/D converter. The A/D converter 40 may be another type of A/D converter known in the art.

A lower limit target value (minimum value) and an upper limit target value (maximum value) of an input range (dynamic range) of the image signal IM2 input from the analog processing circuit 20 to the A/D converter 40 are set in a target register 100. The lower limit target value and the upper limit target value may be set by an external CPU (firmware which operates on CPU) or the like. Note that only the lower limit target value or the upper limit target value may be set.

The calculation circuit 50 (correction circuit) monitors the A/D-converted value ADV output from the A/D converter 40, and performs calculations (corrections). Specifically, the calculation circuit 50 monitors and acquires the A/D-converted value ADV in a lower limit value output period (black reference pixel output period in a narrow sense) in which the A/D-converted value corresponding to the lower limit value (minimum value) of the input range is output from the A/D converter 40. The calculation circuit 50 then performs an offset setting process (lower limit value setting process) that sets an offset control value which causes the A/D-converted value ADV (average value of the A/D-converted value ADV) to become closer to the lower limit target value set in the target register 100 (i.e., offset control value which causes the A/D-converted value ADV to coincide with the lower limit target value) in the offset control register 24. Or, the calculation circuit 50 monitors and acquires the A/D-converted value ADV in an upper limit value output period (white pixel output period in a narrow sense) in which the A/D-converted value corresponding to the upper limit value (maximum value) of the input range is output from the A/D converter 40. The calculation circuit 50 then performs a gain setting process (upper limit value setting process) that sets a gain control value which causes the A/D-converted value ADV (average value of the A/D-converted value ADV) to become closer to the upper limit target value set in the target register 100 (i.e., gain control value which causes the A/D-converted value ADV to coincide with the upper limit target value) in the gain control register 26.

Figure 3A:
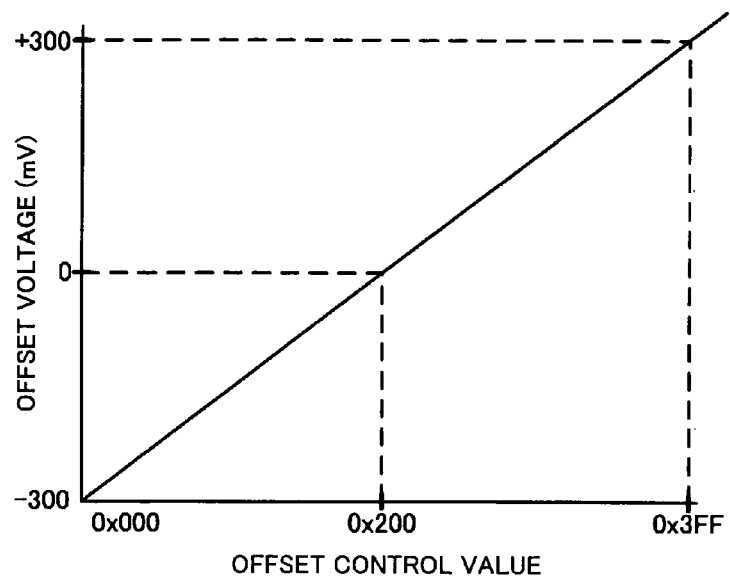
FIGS. 3A and 3B are views showing the relationship between an offset control value and an offset voltage and the relationship between a gain control value and a gain.

FIG. 3A shows an example of the relationship between the offset control value and the offset voltage in the offset control circuit 23. For example, when an offset control value 0x200 is set in the offset control register 24 with a 10-bit width (n-bit width in a broad sense), an offset voltage added to the image signal by the offset control circuit 23 is 0 V. When an offset control value 0x000 or 0x3FF is set in the offset control register 24, the offset voltage added to the image signal is −300 mV or +300 mV, respectively. Specifically, the offset voltage is a monotone function with respect to the offset control value, as shown in FIG. 3A.

Figure 3B:
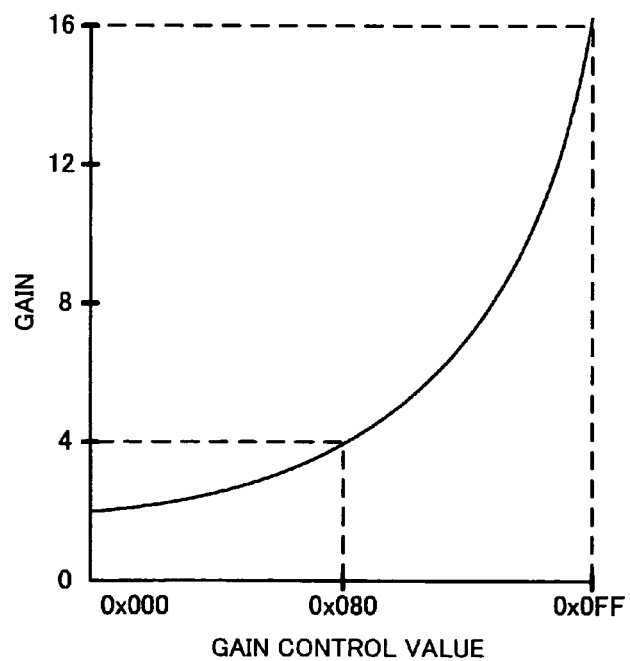

FIG. 3B shows an example of the relationship between the gain control value and the gain in the gain control circuit 25. For example, when a gain control value 0x080 is set in the gain control register 26 with an 8-bit width, the gain of the gain control circuit 25 (programmable gain amplifier PGA) is about four. When a gain control value 0x0FF is set in the gain control register 26, the gain of the gain control circuit 25 is about 16. Specifically, the gain is a monotone function with respect to the gain control value, as shown in FIG. 3B.

In this embodiment, control which fully utilizes the conversion range of the A/D converter 40 is implemented by performing offset control and gain control as shown in FIGS. 3A and 3B.

Figure 4:
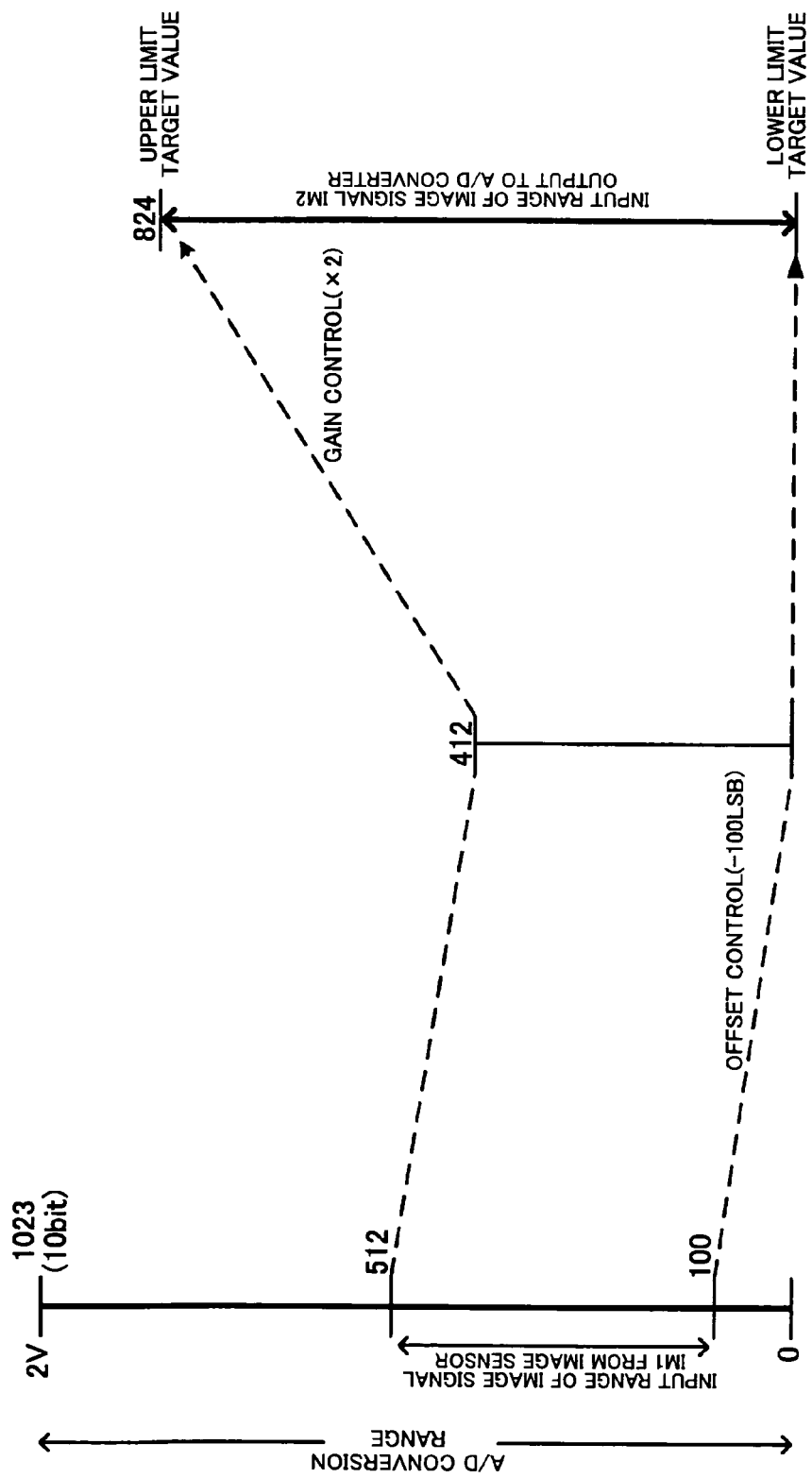
FIG. 4 is a view illustrative of effective utilization of the conversion range of an A/D converter.

In FIG. 4, the A/D conversion range of the 10-bit A/D converter 40 is 0 to 1023 (0 to 1023 LSB), for example. The A/D conversion range is 0 to 2 V as an analog voltage range, for example. The LSB of the A/D converter 40 is indicated as 1. The input range of the input image signal IM1 from the image sensor 10 is 100 to 512 (100 to 512 LSB). The input range of the input image signal IM1 is narrower than the A/D conversion range (0 to 1023) so that the conversion characteristics of the A/D converter 40 are not fully utilized.

In FIG. 4, the lower limit target value of the input range of the image signal IM2 input to the A/D converter 40 is set at 0 (i.e., offset control of −100 (−100 LSB)), for example. Therefore, the minimum value (lower limit value) of the input range of the image signal IM2 is shifted from 100 to 0 by offset control. In this case, the maximum value (upper limit value) of the input range is also shifted from 512 to 412.

In FIG. 4, the upper limit target value of the input range of the image signal IM2 input to the A/D converter 40 is set at 824 (×2 gain control), for example. Therefore, the maximum value (upper limit value) of the input range of the image signal IM2 is shifted from 412 to 824 by gain control.

This causes the input range of the image signal IM2 to increase from 100 to 512 to 0 to 824 and become almost equal to the A/D conversion range (0 to 1024), whereby the conversion characteristics of the A/D converter 40 can be fully utilized.

According to this embodiment, the lower limit target value set in the target register 100 shown in FIG. 2 is set at 0, for example. The calculation circuit 50 performs a calculation process which sets the offset control value which causes the A/D-converted value ADV to become closer to the lower limit target value (=0) in the offset control register 24. This causes the offset control circuit 23 to perform an offset control of −100 so that the minimum value of the input range of the image signal IM2 is shifted from 100 to 0. It is desirable to set the lower limit target value to be larger than 0 (e.g., 10 or more) so that the input range is not set across 0.

According to this embodiment, the upper limit target value set in the target register 100 shown in FIG. 2 is set at 824, for example. The calculation circuit 50 performs a calculation process which sets the gain control value which causes the A/D-converted value ADV to become closer to the upper limit target value (=824) in the gain control register 26. This causes the gain control circuit 25 to perform ×2 gain control so that the maximum value of the input range of the image signal IM2 is shifted from 412 to 824. Therefore, the input range of the image signal IM2 can be set at 0 to 824, whereby the dynamic range of the A/D converter 40 can be increased.

3. Detailed Configuration

Figure 5:
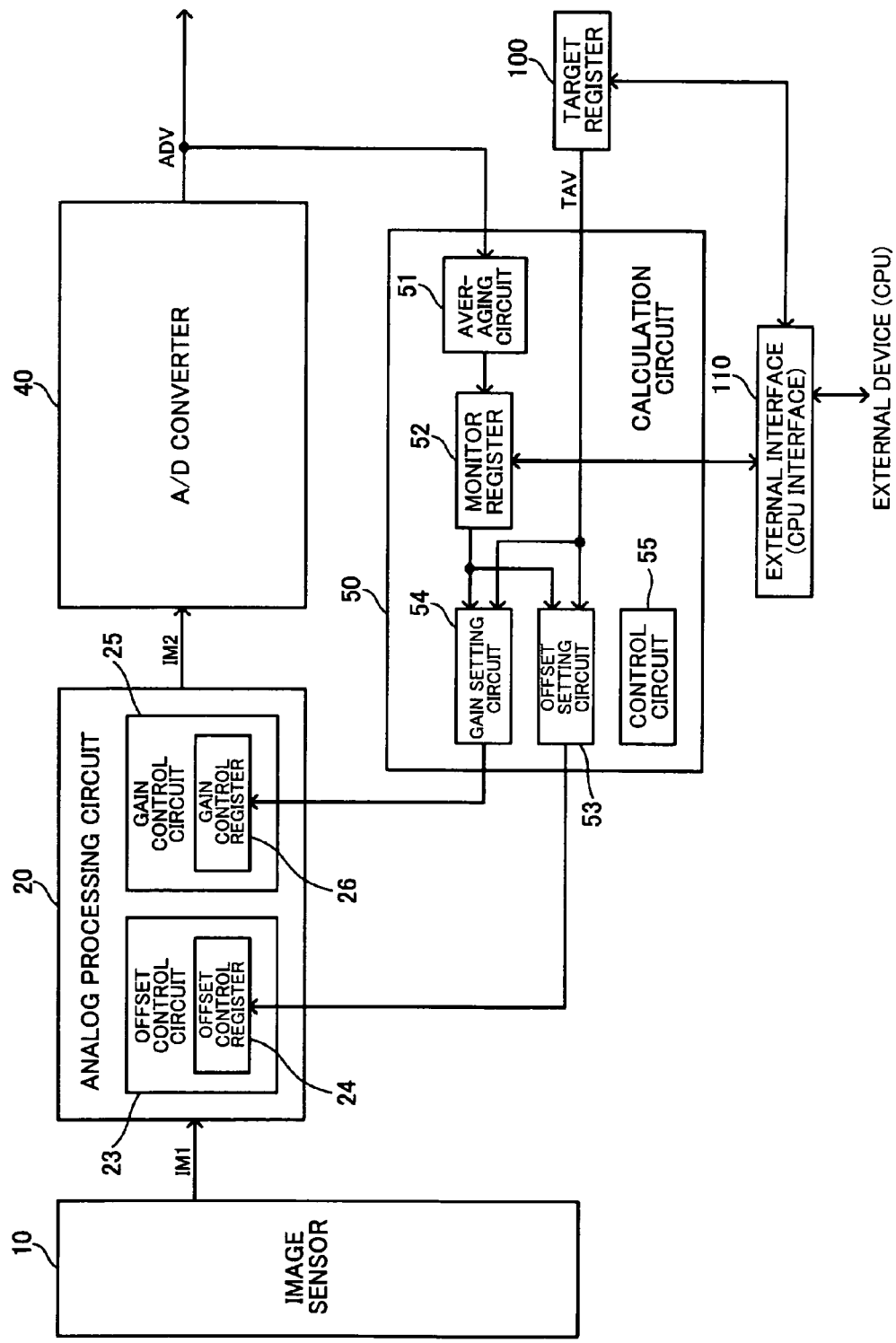
FIG. 5 shows a detailed configuration example of an analog front-end circuit according to one embodiment of the invention.

FIG. 5 shows a detailed configuration example of the analog front-end circuit. Note that the analog front-end circuit is not limited to the configuration shown in FIG. 5. Various modifications may be made such as omitting some elements (e.g., averaging circuit, monitoring circuit, or external interface), or adding other elements.

In FIG. 5, the calculation circuit 50 includes an averaging circuit 51, a monitor register 52, an offset setting circuit 53, a gain setting circuit 54, and a control circuit 55.

The averaging circuit 51 averages the A/D-converted values ADV output from the A/D converter 40. Specifically, the averaging circuit 51 monitors the A/D-converted value in a black reference pixel output period (lower limit value output period) or a white pixel output period (upper limit value output period). The averaging circuit 51 extracts the A/D-converted values of the image signals of a plurality of pixels in each processing line of the image sensor 10, and averages the A/D-converted values. The calculation circuit 50 compares the averaged A/D-converted value of a plurality of pixels with the lower limit target value or the upper limit target value set in the target register 100.

The monitor register 52 is a register in which a monitor value of the A/D-converted value ADV output from the A/D converter 40 is set. Specifically, the A/D-converted value averaged by the averaging circuit 51 is set in the monitor register 52 as the monitor value, for example.

Specifically, the analog front-end circuit shown in FIG. 5 includes an external interface 110 (CPU interface or host interface) used to externally access the target register 100 and the monitor register 52. A CPU (host processor or firmware) accesses the target register 100 and the monitor register 52 through the external interface 110. The CPU sets the lower limit target value and the upper limit target value in the target register 100, or monitors the monitor value of the A/D-converted value set in the monitor register 52.

The CPU can set the desired lower limit target value and upper limit target value in the target register 100 by providing the external interface 110. Therefore, the user can arbitrarily set the input range of the image signal input to the A/D converter 40, as described with reference to FIG. 4. Moreover, the final A/D-converted value after completion of gain control and offset control can be monitored using the monitor register 52. This enables the user to check whether or not an appropriate lower limit value and upper limit value have been set at any time, whereby convenience can be improved.

The offset setting circuit 53 compares the A/D-converted value (average value) with the lower limit target value set in the target register 100. The offset setting circuit 53 performs a process which sets the offset control value that causes the A/D-converted value to become closer to the lower limit target value in the offset control register 24, as described with reference to FIG. 4. Specifically, the offset setting circuit 53 determines the offset control value that causes the A/D-converted value to coincide (almost coincide) with the lower limit target value by means of binary search, for example, and writes the offset control value in the offset control register 24.

The gain setting circuit 54 compares the A/D-converted value (average value) with the upper limit target value set in the target register 100. The gain setting circuit 54 performs a process which sets the gain control that causes the A/D-converted value to become closer to the upper limit target value in the gain control register 26, as described with reference to FIG. 4. Specifically, the gain setting circuit 54 determines the offset control value that causes the A/D-converted value to coincide (almost coincide) with the upper limit target value by means of binary search, for example, and writes the gain control value in the gain control register 26.

The control circuit 55 controls the entire calculation circuit 50. Specifically, the control circuit 55 controls the sequence of each circuit included in the calculation circuit 50, and performs various determination processes.

4. Operation

Figure 6:
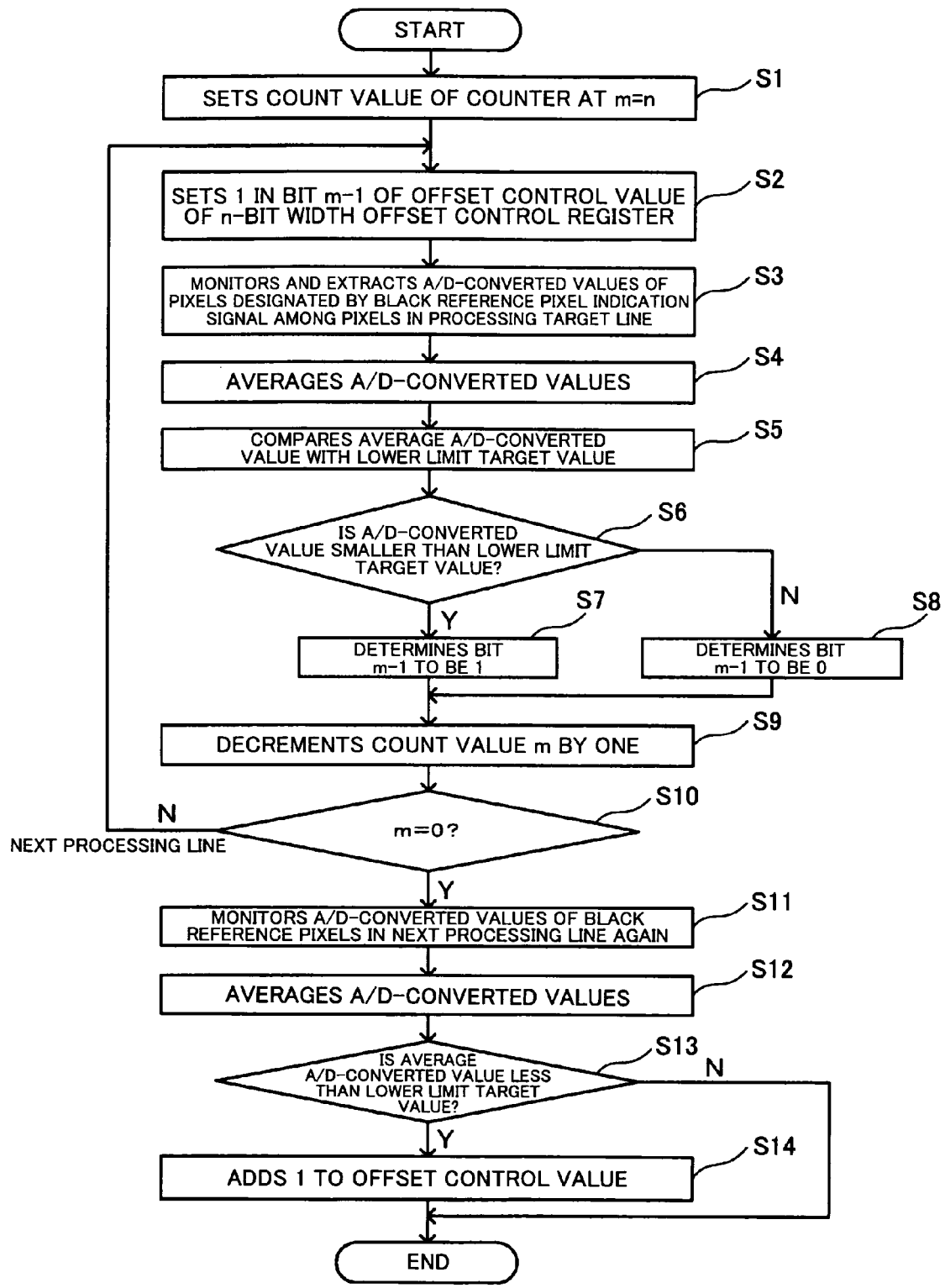
FIG. 6 is a flowchart illustrative of an offset setting process.

A detailed operation example according to this embodiment is described below with reference to flowcharts shown in FIGS. 6 and 7. FIG. 6 is a flowchart showing the offset setting process.

The calculation circuit 50 sets the count value of a counter at m=n (n≧m≧0) (step S1). The calculation circuit 50 then sets 1 in bit m−1 of the offset control value set in the n-bit width offset control register 24 (step S2). For example, when m=n=10, the calculation circuit 50 sets 1 in the most significant bit 9 (=m−1) of the offset control value set in the 10-bit width offset control register 24.

The calculation circuit 50 monitors and extracts the A/D-converted values of pixels designated by a black reference pixel indication signal described later among the pixels in the processing target line (step S3). The calculation circuit 50 averages the extracted A/D-converted values of the pixels (step S4).

The calculation circuit 50 then compares the average A/D-converted value with the lower limit target value set in the target register 100 (step S5). When the A/D-converted value is smaller than the lower limit target value, the calculation circuit 50 determines the logic level of bit m−1 of the offset control value to be 1. When the A/D-converted value is larger than the lower limit target value, the calculation circuit 50 determines the logic level of bit m−1 of the offset control value to be 0 (steps S6, S7, and S8). When the A/D-converted value is equal to the lower limit target value, the calculation circuit 50 may determine the logic level of bit m−1 of the offset control value to be either 1 or 0.

The calculation circuit 50 then decrements the count value m of the counter by one (step S9). For example, when m=10, the calculation circuit 50 decrements the count value m to m=9. The calculation circuit 50 determines whether or not m=0 (step S10). When m is not 0, the calculation circuit 50 returns to the step S2, and performs the offset setting process in the steps S2 to S9 on pixels in the next processing line.

When the logic levels of all bits of the offset control value have been determined (m=0), the calculation circuit 50 monitors the A/D-converted values of black reference pixels in the next processing line, for example (step S11). The calculation circuit 50 then averages the extracted A/D-converted values (step S12). When the average A/D-converted value is less than the lower limit target value, the calculation circuit 50 adds 1 to the offset control value set in the offset control register 24 (steps S13 and S14).

According to this embodiment, the comparison process which sets 1 in bit m−1 of the offset control value set in the n-bit width offset control register 24 and compares the A/D-converted value with the lower limit target value (steps S2 to S5), the bit determination process which determines the logic level of bit m−1 of the offset control value to be 1 when the A/D-converted value is smaller than the lower limit target value and determines the logic level of bit m−1 of the offset control value to be 0 when the A/D-converted value is larger than the lower limit target value (steps S6 to S8), and the decrement process which decrements m by one (steps S1 and S9) are repeated until m becomes 0 from n (step S10), as described above.

This makes it possible to cause the A/D-converted value to coincide (almost coincide) with the lower limit target value while causing the A/D-converted value to gradually become closer to the lower limit target value by means of binary search. Therefore, offset control for fully utilizing the A/D conversion range of the A/D converter 40 can be automatically completed in a short period of time. This makes it possible to reduce the setup (preparation) time before reading a document as compared with the case of performing offset control using a closed-loop feedback within the image sensor, the analog front-end circuit, and the CPU. Moreover, since an offset control process performed by the CPU becomes unnecessary, an offset control program for the firmware need not developed, whereby the development man-hours of the user can be reduced.

According to this embodiment, the A/D-converted value output from the A/D converter is again monitored after the logic levels of all bits of the offset control value have been determined (m=0) (steps S10 and S11). When the A/D-converted value is smaller than the lower limit target value, 1 is added to the offset control value (steps S13 and S14).

This prevents a situation in which the lower limit value of the input image signal input to the A/D converter 40 becomes smaller than the lower limit target value described with reference to FIG. 4 (i.e., becomes smaller than the lower limit value of the A/D conversion range) so that the input image signal falls outside the A/D conversion range.

In this embodiment, the final A/D-converted value using the offset control value thus determined is set in the monitor register 52. An external device such as the CPU can access the monitor register 52 through the external interface 110 and monitor the final A/D-converted value. Therefore, the user can externally check whether or not the A/D-converted value (lower limit value of the A/D conversion range) using the determined offset control value coincides with the lower limit target value set in the target register 100. This improves convenience to the user.

Figure 7:
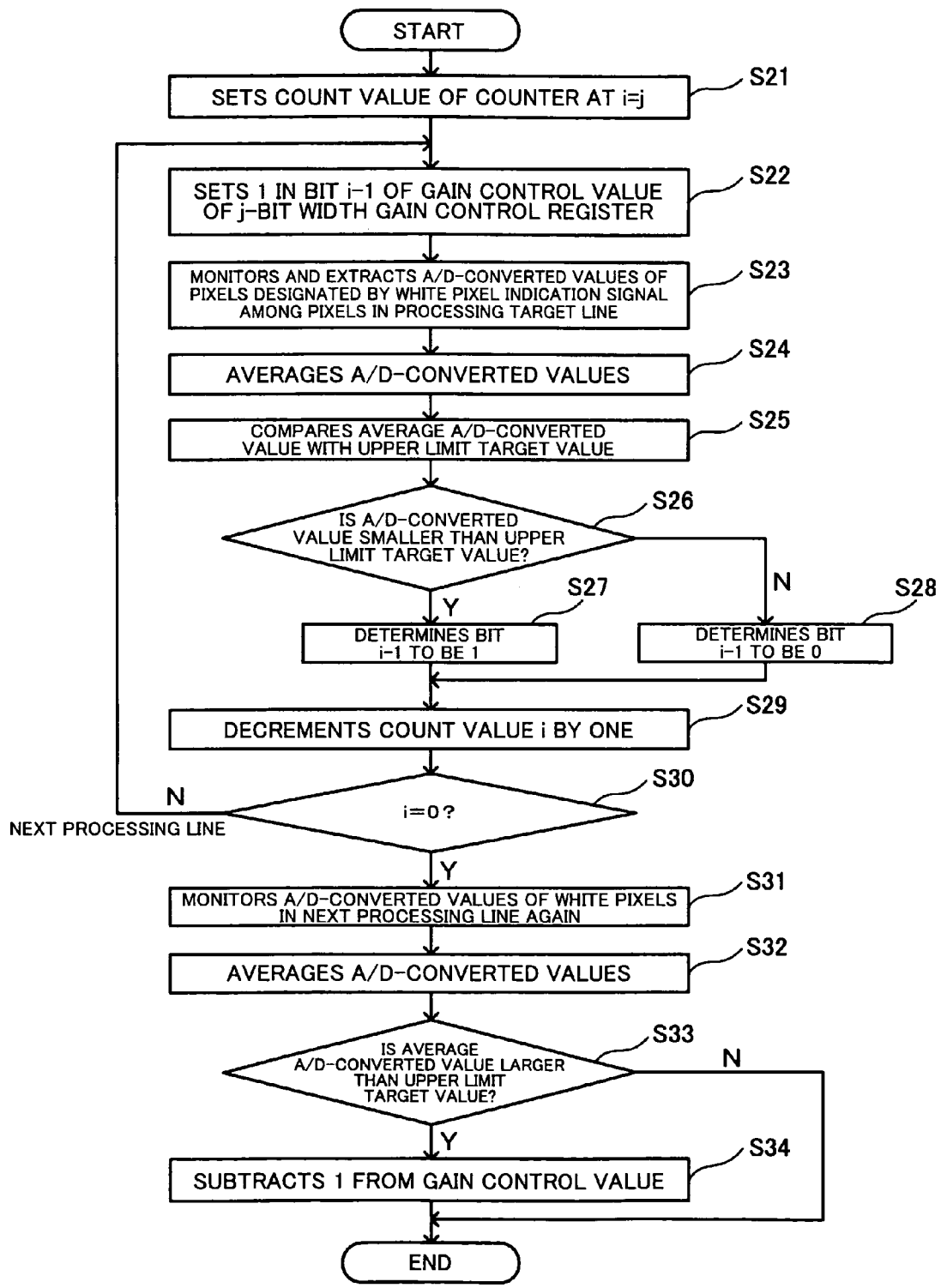
FIG. 7 is a flowchart illustrative of a gain setting process.

FIG. 7 is a flowchart showing the gain setting process. The calculation circuit 50 sets the count value of a counter at i=j (j≧i≧0) (step S21). The calculation circuit 50 then sets 1 in bit i−1 of the gain control value set in the j-bit width gain control register 26 (step S22). For example, when i=j=8, the calculation circuit 50 sets 1 in the most significant bit 7 (=i−1) of the gain control value set in the 8-bit width gain control register 26.

The calculation circuit 50 monitors and extracts the A/D-converted values of pixels designated by a white pixel indication signal described later among the pixels in the processing target line (step S23). The calculation circuit 50 averages the extracted A/D-converted values of the pixels (step S24).

The calculation circuit 50 then compares the average A/D-converted value with the upper limit target value set in the target register 100 (step S25). When the A/D-converted value is smaller than the upper limit target value, the calculation circuit 50 determines the logic level of bit i−1 of the gain control value to be 1. When the A/D-converted value is larger than the upper limit target value, the calculation circuit 50 determines the logic level of bit i−1 of the gain control value to be 0 (steps S26, S27, and S28). When the A/D-converted value is equal to the upper limit target value, the calculation circuit 50 may determine the logic level of bit i−1 of the gain control value to be either 1 or 0.

The calculation circuit 50 then decrements the count value i of the counter by one (step S29). For example, when i=8, the calculation circuit 50 decrements the count value i to i=7. The calculation circuit 50 determines whether or not i=0 (step S30). When i is not 0, the calculation circuit 50 returns to the step S22, and performs the gain setting process in the steps S22 to S29 on pixels in the next processing line.

When the logic levels of all bits of the offset control value have been determined (i=0), the calculation circuit 50 monitors the A/D-converted values of white pixels in the next processing line, for example (step S31). The calculation circuit 50 then averages the extracted A/D-converted values (step S32). When the average A/D-converted value is larger than the upper limit target value, the calculation circuit 50 subtracts 1 from the gain control value set in the gain control register 26 (steps S33 and S34).

According to this embodiment, the comparison process which sets 1 in bit i−1 of the gain control value set in the j-bit width gain control register 26 and compares the A/D-converted value with the upper limit target value (steps S22 to S25), the bit determination process which determines the logic level of bit i−1 of the gain control value to be 1 when the A/D-converted value is smaller than the upper limit target value and determines the logic level of bit i−1 of the gain control value to be 0 when the A/D-converted value is larger than the upper limit target value (steps S26 to S28), and the decrement process which decrements i by one (steps S21 and S29) are repeated until i becomes 0 from j (step S30), as described above.

This makes it possible to cause the A/D-converted value to coincide (almost coincide) with the upper limit target value while causing the A/D-converted value to gradually become closer to the upper limit target value by means of binary search. Therefore, gain control for fully utilizing the A/D conversion range of the A/D converter 40 can be automatically completed in a short period of time. This makes it possible to reduce the setup (preparation) time before reading a document as compared with the case of performing gain control using a closed-loop feedback within the image sensor, the analog front-end circuit, and the CPU. Moreover, since a gain control process performed by the CPU becomes unnecessary, a gain control program for the firmware need not developed, whereby the development man-hours of the user can be reduced.

According to this embodiment, the A/D-converted value output from the A/D converter is again monitored after the logic levels of all bits of the gain control value have been determined (i=0) (steps S30 and S31). When the A/D-converted value is larger than the upper limit target value, 1 is subtracted from the gain control value (steps S33 and S34).

This prevents a situation in which the upper limit value of the input image signal input to the A/D converter 40 becomes larger than the upper limit target value described with reference to FIG. 4 (i.e., becomes larger than the upper limit value of the A/D conversion range) so that the input image signal falls outside the A/D conversion range.

In this embodiment, the final A/D-converted value using the gain control value thus determined is set in the monitor register 52. An external device such as the CPU can access the monitor register 52 through the external interface 110 and monitor the final A/D-converted value. Therefore, the user can externally check whether or not the A/D-converted value (upper limit value of the A/D conversion range) using the determined gain control value coincides with the upper limit target value set in the target register 100. This improves convenience to the user.

FIG. 8A shows an example of the offset setting process when the resolution of the A/D converter 40 is 10 bits, the bit width of the offset control register 24 is n=10 bits, and the lower limit target value is 0x040.

The count value of the counter is set at m=n=10 in the first processing line (step S1 in FIG. 6). Since the most significant bit 9 (=m−1) of the 10-bit width offset control value is set at 1 during analysis (step S2), the offset control value is 10_0000_0000. The A/D-converted values of the image signals of the black reference pixels in the first processing line are then monitored. Suppose that the monitored A/D-converted values are averaged to 0x020. In this case, since the A/D-converted value (=0x020) is smaller than the lower limit target value (0x040), bit 9 of the offset control value is determined to be 1 (steps S6 and S7). Therefore, the offset control value 10_0000_0000 is set in the offset control register 24 after completion of analysis.

The count value is decremented by one (m=9) in the second processing line (step S9). Since bit 8 (=m−1) of the offset control value is set at 1 (step S2), the offset control value is 11_0000_0000. Suppose that the A/D-converted values of the image signals of the black reference pixels in the second processing line have been monitored and averaged to 0x045. In this case, since the A/D-converted value (=0x045) is larger than the lower limit target value (0x040), bit 8 of the offset control value is determined to be 0 (steps S6 and S8). Therefore, the offset control value is 10_0000_0000 after completion of analysis.

The count value is decremented by one (m=8) in the third processing line (step S9). Since bit 7 (=m−1) of the offset control value is set at 1 (step S2), the offset control value is 11_1000_0000. Suppose that the A/D-converted values of the image signals of the black reference pixels in the third processing line have been monitored and averaged to 0x035. In this case, since the A/D-converted value (=0x035) is smaller than the lower limit target value (0x040), bit 7 of the offset control value is determined to be 1 (steps S6 and S7). Therefore, the offset control value is 10_1000_0000 after completion of analysis.

The process is performed as described above until the tenth processing line is reached. The A/D-converted value in the tenth processing line is 0x041, which is larger than the lower limit target value (0x040). Therefore, bit 0 is determined to be 0 so that the offset control value is 10_1xxx_xxx0.

In this embodiment, after the logic levels of all bits of the offset control value have been determined, the A/D-converted values in the eleventh processing line are again monitored using the offset control value (step S11). When the A/D-converted value is smaller than the lower limit target value (0x040), 1 is added to the offset control value 10_1xxx_xxx0 to obtain an offset control value 10_1xxx_xxx1 (steps S13 and S14). This prevents a situation in which the lower limit value of the input image signal input to the A/D converter 40 becomes smaller than the lower limit target value so that the input image signal falls outside the A/D conversion range.

FIG. 8B shows an example of the gain setting process when the resolution of the A/D converter 40 is 10 bits, the bit width of the gain control register 26 is j=8 bits, and the upper limit target value is 0x3C0.

The count value of the counter is set at i=j=8 in the first processing line (step S21 in FIG. 7). Since bit 7 (=i−1) of the 8-bit width gain control value is set at 1 (step S22), the gain control value is 1000_0000. Suppose that the A/D-converted values of the image signals of the white pixels in the first processing line have been monitored and averaged to 0x3FF. In this case, since the A/D-converted value (=0x3FF) is larger than the upper limit target value (0x3C0), bit 7 of the gain control value is determined to be 0 (steps S26 and S28). Therefore, the gain control value 0000_0000 is set in the gain control register 26 after completion of analysis.

In FIG. 8B, since the A/D-converted value (=0x310) in the second processing line is smaller than the upper limit target value (0x3C0), bit 6 of the gain control value is determined to be 1. Since the A/D-converted value (=0x3E0) in the third processing line is larger than the upper limit target value (0x3C0), bit 5 of the gain control value is determined to be 0.

The process is performed until the eighth processing line is reached. The A/D-converted value in the eighth processing line is 0x3C1, which is larger than the upper limit target value (0x3C0). Therefore, bit 0 is determined to be 0 so that the gain control value is 010x_xxx0.

In this embodiment, after the logic levels of all bits of the gain control value have been determined, the A/D-converted values in the eleventh processing line are again monitored using the gain control value (step S31). When the A/D-converted value is larger than the upper limit target value (0x3C0), 1 is subtracted from the gain control value 010x_xxx0 (steps S33 and S34). This prevents a situation in which the upper limit value of the input image signal input to the A/D converter 40 becomes larger than the upper limit target value so that the input image signal falls outside the A/D conversion range.

5. Repeated Gain/Offset Setting Process

This embodiment employs a method which alternately repeats the gain setting process and the offset process a plurality of times.

As shown in FIG. 9, the offset setting process (see FIG. 6) is performed using image signals of pixels in lines 1 to 11 (Gth to Hth lines in a broad sense) of the image sensor 10, and the gain setting process (see FIG. 7) is then performed using image signals of pixels in lines 13 to 21 (Ith to Jth lines in a broad sense) of the image sensor 10, for example. The offset setting process is then performed using image signals of pixels in lines 23 to 33 of the image sensor 10, and the gain setting process is then performed using image signals of pixels in lines 35 to 43 of the image sensor 10. Specifically, a setting process which includes the offset setting process and the gain setting process is repeated twice (a plurality of times in a broad sense).

In this embodiment, as shown in FIG. 9, after performing the offset setting process using image signals of pixels in lines 1 to 11 (Gth to Hth lines), the offset setting process and the gain setting process are not performed on line 12 (dummy line) between line 11 (Hth line) and line 13 (Ith line). The gain setting process is then performed using image signals of pixels in lines 13 to 21 (Ith to Jth lines). Likewise, the offset setting process and the gain setting process are not performed on lines 22 and 34 (dummy lines).

As shown in FIG. 9, the offset control value is set in lines 1 to 11 in a state in which the gain control value is set at an initial value, for example. Specifically, bits 9 to 0 of the 10-bit width offset control value are set (steps S1 to S10 in FIG. 6) using the A/D-converted values of the pixels in lines 1 to 10, and 1 is added to the offset control value (steps S11 to S14) using the A/D-converted values of the pixels in line 11. The offset setting process and the gain setting process are not performed on line 12 in order to stabilize the analog processing circuit 20 and the A/D converter 40.

The gain control value setting process is performed on the subsequent lines 13 to 21 in a state in which the offset control value obtained by the process performed on lines 1 to 11 is set in the offset control register 24. Specifically, bits 7 to 0 of the 8-bit width gain control value are set (steps S21 to S30 in FIG. 7) using the A/D-converted values of the pixels in lines 13 to 20, and 1 is subtracted from the gain control value (steps S31 to S34) using the A/D-converted values of the pixels in line 21. The offset setting process and the gain setting process are not performed on line 22 in order to stabilize the analog processing circuit 20 and the A/D converter 40.

The offset control value setting process is performed on the subsequent lines 23 to 33 in a state in which the gain control value obtained by the process performed on lines 13 to 21 is set in the gain control register 26. Specifically, bits 9 to 0 of the offset control value are set using the A/D-converted values of the pixels in lines 23 to 32, and 1 is added to the offset control value using the A/D-converted values of the pixels in line 33. The offset setting process and the gain setting process are not performed on line 34.

Likewise, the gain control value setting process is performed on the subsequent lines 35 to 43 using the offset control value obtained by the process performed on lines 23 to 33. Specifically, bits 7 to 0 of the gain control value are set in lines 35 to 42, and 1 is subtracted from the gain control value in line 43.

For example, when the gain is controlled in lines 13 to 21 after controlling the offset in lines 1 to 11, the offset may vary to a small extent. Specifically, when the gain is controlled in lines 13 to 21 after causing the A/D-converted value corresponding to the lower limit value to coincide with the lower limit target value by controlling the offset in lines 1 to 11, the A/D-converted value may not coincide with the lower limit target value.

In FIG. 9, after controlling the gain in lines 13 to 21, the offset is again controlled in lines 23 to 33 using the resulting gain control value. This allows offset control to be performed taking the gain control results into consideration, whereby the accuracy of coincidence between the A/D-converted value (A/D-converted value of black reference pixels) corresponding to the lower limit value and the lower limit target value can be increased.

In FIG. 9, after controlling the offset in lines 23 to 33, the gain is again controlled in lines 35 to 43 using the resulting offset control value. This allows gain control to be performed taking the offset control results into consideration, whereby the accuracy of coincidence between the A/D-converted value (A/D-converted value of white pixels) corresponding to the upper limit value and the upper limit target value can be increased.

Moreover, the operation of the analog processing circuit 20 and the A/D converter 40 can be stabilized before offset control or gain control by providing the dummy lines such as lines 12, 22, and 34, whereby the accuracy of offset control and gain control can be increased. Note that a dummy line in which offset control and gain control are not performed may be set before line 1 or after line 43.

6. Timing Generator

Figure 10:
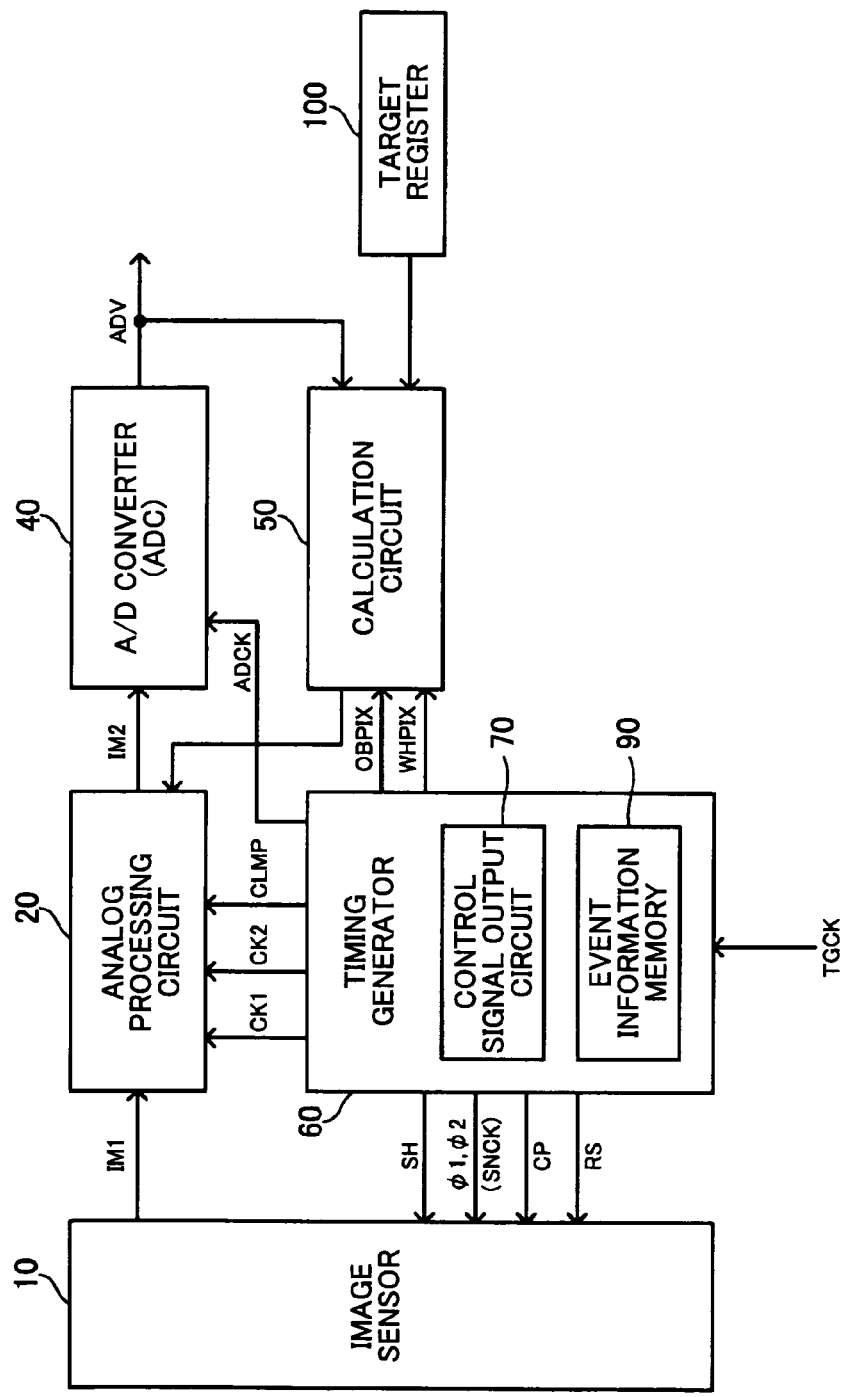
FIG. 10 shows a modification of an analog front-end circuit according to one embodiment of the invention.

FIG. 10 shows a modification of the analog front-end circuit according to this embodiment. In FIG. 10, a timing generator 60 is added to the configuration shown in FIGS. 2 and 5.

The timing generator 60 generates a plurality of control signals supplied to the image sensor 10. The control signals generated by the timing generator 60 include drive signals for the image sensor 10 and drive signals (control signals) for the analog front-end circuit, for example.

The drive signals for the image sensor 10 include the shift signal SH, the drive clock signals φ1 and φ2 (SNCK), a clamping signal CP, a reset signal RS, and the like. The timing generator 60 generates the drive signals SH, φ1, φ2, CP, RS and the like, and supplies the generated drive signals to the image sensor 10 to drive (control) the image sensor 10.

The drive signals for the analog front-end circuit include an A/D conversion clock signal (reference clock signal) ADCK, sampling clock signals CK1 and CK2, a clamping signal CLMP, and the like. The timing generator 60 generates the clock signal ADCK, and supplies the clock signal ADCK to the A/D converter 40. The timing generator 60 generates the sampling clock signals CK1 and CK2 and the clamping signal CLMP, and supplies the sampling clock signals CK1 and CK2 and the clamping signal CLMP to the analog processing circuit 20.

The timing generator 60 includes a control signal output circuit 70 and an event information memory 90.

The control signal output circuit 70 generates the control signals based on information read from the event information memory 90 (RAM), and outputs the generated control signals, for example. The event information memory 90 stores a pixel number (pixel number identification information) and control signal change event occurrence information (toggle indication information) associated with the pixel number at each address. The control signal output circuit 70 generates the control signals (e.g., shift signals SH (SH1 to SH6 and SHX) and the clock control signal) based on the pixel number and the change event occurrence information read from the event information memory 90.

The pixel number (pixel count or pixel position) stored in the event information memory 90 is information which specifies the position of each pixel of the image sensor 10. The pixel number is arbitrary. The change event occurrence information (event information) stored in the event information memory 90 is information which designates (specifies) a control signal that undergoes a signal level change event at the pixel number associated with the change event occurrence information (i.e., pixel number stored at the same address).

Suppose that the signal level of the ith control signal among a plurality of control signals has changed at an jth pixel number (pixel position), for example. For example, the ith control signal has changed from the L level ("0") to the H level ("1") or changed from the H level to the L level. In this case, the jth pixel number is stored at the kth address of the event information memory 90, and the change event occurrence information (change event occurrence bit) which is information (bit) that designates (specifies) the ith control signal is also stored at the kth address of the event information memory 90 while being associated with the jth pixel number.

It is possible to deal with the case where a change event relating to the signal level of the control signal frequently occurs using a relatively small circuit configuration by providing such an event information memory 90.

As a method according to a comparative example, timing information which determines the signal change point may be set in a timing setting register, and the control signals such as the shift signal SH may be generated using the set timing information.

In the method according to a comparative example, the timing setting registers are required in a number corresponding to the number of signal level change events. According to the configuration of FIG. 10, signal level change events can be set in a number corresponding to at least the address volume (depth) of the event information memory 90. Therefore, the number of control signal change points can be increased, whereby it is possible to deal with various image sensors. Moreover, since the user can change the signal change point merely by rewriting the information stored in the event information memory 90, a change in circuit accompanying a change in signal change point can be minimized.

Figure 11:
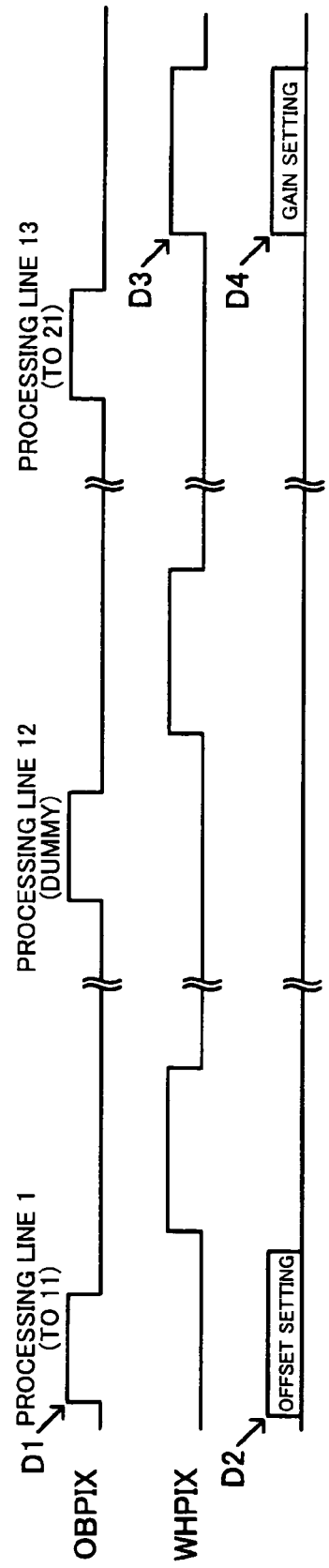
FIG. 11 is a view illustrative of a black reference pixel indication signal and a white pixel indication signal.

In this embodiment, the timing generator 60 shown in FIG. 10 outputs a black reference pixel indication signal OBPIX which designates the black reference pixel output period (lower limit value output period) as the control signal. Specifically, the timing generator 60 activates the black reference pixel indication signal OBPIX in a period in which the A/D-converted value of the black reference pixel is output from the A/D converter 40, as indicated by D1 in FIG. 11. The calculation circuit 50 monitors the A/D-converted value output from the A/D converter 40 when the signal OBPIX has become active, and compares the A/D-converted value with the lower limit target value. Specifically, the calculation circuit 50 performs the offset setting process described with reference to FIG. 6, as indicated by D2 in FIG. 11. The black reference pixel may be a pixel in a shield area of the image sensor 10, or may be a pixel when a document lamp is turned OFF.

The timing generator 60 outputs a white pixel indication signal WHPIX which designates the white pixel output period (upper limit value output period) as the control signal. Specifically, the timing generator 60 activates the white pixel indication signal WHPIX in a period in which the A/D-converted value of the white pixel (effective pixel when reading a white area) is output from the A/D converter 40, as indicated by D3 in FIG. 11. The calculation circuit 50 monitors the A/D-converted value output from the A/D converter 40 when the signal WHPIX has become active, and compares the A/D-converted value with the upper limit target value. Specifically, the calculation circuit 50 performs the gain setting process described with reference to FIG. 7, as indicated by D4 in FIG. 11.

This enables the signals OBPIX and WHPIX to be automatically generated by the timing generator 60 in the analog front-end circuit so that offset control and gain control can be automatically performed. Therefore, since an external device such as the CPU need not supply the signals OBPIX and WHPIX, processing load imposed on the external device can be reduced. Note that a modification may be made in which the signals OBPIX and WHPIX are supplied from the external device.

7. Event Information Memory

Figure 14:
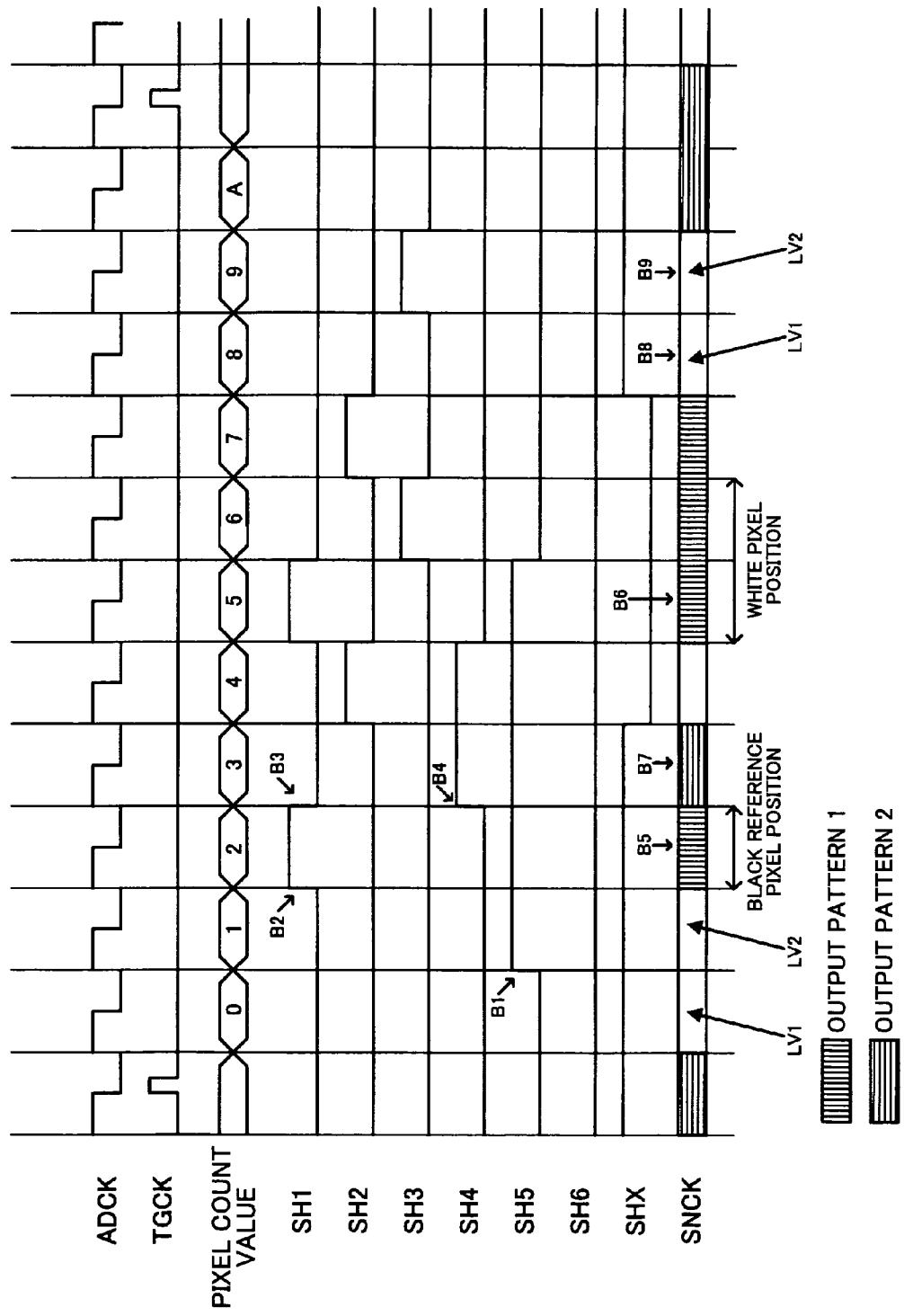
FIG. 14 shows an example of a signal waveform generated using a method according to one embodiment of the invention.

A control signal timing setting method using the event information memory 90 is described below. FIG. 12 shows an example of the memory space of the event information memory 90. FIG. 13 shows an example of signal allocation to each bit. FIG. 14 shows an example of a signal waveform generated using the setting method shown in FIGS. 12 and 13.

In FIG. 12, the data of each event (signal level change event) is set in units of two words (16 bits). The address of the event information memory 90 changes in units of two words (0x02). The data of each event is associated with addresses 0x00, 0x02, 0x04, . . . , 0x7C, and 0x7E.

As shown in FIG. 12, a pixel number PIXNUM[19:0] is allocated to bits 0 to 15 of the first word and bits 0 to 3 (bit 0 to bit L in a broad sense; L is a natural number) of the second word of the data stored at each address of the event information memory 90. The change event occurrence information (toggle indication bit) of the control signals SH1 to SH6, SHX, SNCKCTL, OBPIX, and WHPIX is allocated to bits 4 to 15 (bit (L+1) to bit M in a broad sense; M is a natural number) of the second word of the data stored at each address. The bit allocation of the pixel number and the change event occurrence information is not limited to the example shown in FIG. 12. Various modifications and variations may be made such as changing the order of bit allocation.

In FIG. 12, the control signals SH1 to SH6, SHX, SNCKCTL, OBPIX, and WHPIX are allocated to bits 4 to 15 (bit (L+1) to bit M) of the data at each address. For example, a line number LINEMD is allocated to bit 4, the control signals SH6, SH1 to SH5, and SHX are allocated to bits 5 to 11, the control signal SNCKCTL is allocated to bits 12 and 13, the control signal OBPIX is allocated to bit 14, and the control signal WHPIX is allocated to bit 15.

When each bit of the bits 4 to 15 (bit N of the bit (L+1) to bit M; L+1≦N≦M) is set at "1" (first logic level in a broad sense), the control signal output circuit 70 toggles the signal level of the control signal allocated to that bit (bit N).

For example, bit 10 is set at "1" (first logic level) at the address 0x02 shown in FIG. 12. In this case, the signal level of the signal SH5 allocated to bit 10 is toggled, as indicated by B1 in FIG. 14. Specifically, the signal level changes from the L level to the H level. Bit 6 is set at "1" at the address 0x04 shown in FIG. 12. In this case, the signal level of the signal SH1 allocated to bit 6 is toggled, as indicated by B2 in FIG. 14. Specifically, the signal level changes from the L level to the H level. Bit 6 is set at "1" at the address 0x06. Therefore, the signal level of the signal SH1 allocated to bit 6 is toggled, as indicated by B3 in FIG. 14. In this case, the signal level changes from the H level to the L level.

The control signal timing setting using the event information memory 90 is simplified utilizing the toggle indication information (toggle indication bit) as the change event occurrence information stored in the event information memory 90. This improves convenience to the user.

Note that a method which does not utilize the toggle indication information may also be employed. In FIG. 12, bit 10 corresponding to the signal SH5 is set at "0100001 . . . " in order to set the waveform of the signal SH5 shown in FIG. 14, for example. It is also possible to set bit 10 corresponding to the signal SH5 at "0111110 . . . ".

8. Generation of Shift Signal

In this embodiment, the shift signals SH1 to SH6 and SHX (hereinafter appropriately referred to as "shift signal SH") are generated as the control signals generated based on the event information memory 90. Specifically, the event information memory 90 stores the change event occurrence information relating to the shift signal SH which causes the transfer gate 204 of the image sensor shown in FIG. 1A to be turned ON. The control signal output circuit 70 generates the shift signal SH based on the change event occurrence information relating to the shift signal SH read from the event information memory 90, and outputs the generated shift signal SH.

In FIG. 12, the pixel number and the change event occurrence information are sequentially read in the order from the head address 0x00 to the end address 0x7E of the event information memory 90, for example. Specifically, the pixel number PIXNUM=0x00000 stored at the head address 0x00 is read, and the read pixel number is compared with a pixel count value (count value of pixel counter described later) shown in FIG. 14. When the pixel number coincides with the pixel count value, the signal level of the control signal is set based on bits 4 to 15 which indicate the change event occurrence information stored at the address 0x00. In this case, since bits 4 to 15 are set at "0" (second logic level) (i.e., do not indicate toggle), the signal level of the control signal is not changed.

The pixel number PIXNUM=0x00001 stored at the address 0x02 is then read and compared with the pixel count value shown in FIG. 14. When the pixel number coincides with the pixel count value, the signal level of the control signal is set based on bits 4 to 15 (change event occurrence information) at the address 0x02. In this case, since bit 10 is set at "1", the shift signal SH5 is changed from the L level to the H level, as indicated by B1 in FIG. 14.

The pixel number PIXNUM=0x00002 stored at the address 0x04 is then read and compared with the pixel count value. When the pixel number coincides with the pixel count value, the signal level of the control signal is set based on bits 4 to 15 at the address 0x04. In this case, since bit 6 is set at "1", the shift signal SH1 is changed from the L level to the H level, as indicated by B2 in FIG. 14.

Likewise, the pixel number PIXNUM=0x00003 and bits 4 to 15 are read from the address 0x06, the shift signal SH1 is changed from the H level to the L level, as indicated by B3 in FIG. 14, and the shift signal SH4 is changed from the L level to the H level, as indicated by B4 in FIG. 14.

In FIG. 12, the pixel numbers PIXNUM stored at the addresses 0x00, 0x02, 0x04, . . . are incremented by one, such as 0x00000, 0x00001, 0x00002, 0x00003, . . . for convenience of description. Note that the pixel numbers PIXNUM may be incremented in an arbitrary manner. For example, the pixel numbers PIXNUM may be incremented by two or more, such as 0x00000, 0x00002, . . . , or may be incremented randomly, such as 0x00000, 0x00002, 0x00006, . . . .

It is possible to easily deal with various image sensors by generating the shift signal using the above-described method. Suppose that the first rise timings of the shift signals SH1 to SH3 (R, G, and B shift signals) are the same in a first image sensor and differ in a second image sensor, for example. According to this embodiment, it is possible to easily deal with the first and second image sensors merely by rewriting the data stored in the event information memory 90. Therefore, a change in circuit or the like can be minimized, whereby the development period and the development cost can be reduced.

At the address 0x16 and the subsequent addresses in FIG. 12, the pixel number (PIXNUM) is set at 0xFFFFF which is finish indication information (finish indication number) indicating that the change event has finished. The change event occurrence information at the bits 4 to 15 is set at 0xFFF which is the finish indication information.

For example, the pixel number and the change event occurrence information are sequentially read in the order from the head address 0x00 to the end address 0x7E of the event information memory 90. When the pixel number and the change event occurrence information which have been read are set to the finish indication information (0xFFFFF and 0xFFF) such as at the address 0x16, the control signal output circuit 70 (read circuit) returns a read pointer of the event information memory 90 to the head address 0x00 before the end address 0x7E is reached, as indicated by A1 in FIG. 12.

This prevents a situation in which the pixel number and the change event occurrence information are unnecessarily read even if a change event does not occur, whereby the process efficiency can be increased. For example, the number of signal level change events may differ depending on the image sensor. In this case, the information relating to the change event can be efficiently stored in the event information memory 90 using the method which detects the finish indication information and returns the read pointer, as indicated by A1 in FIG. 12. Moreover, the efficiency of the information read process can be increased.

When the finish indication information (0xFFFFF and 0xFFF) is not set, for example, the read pointer of the event information memory 90 may be returned to the head address 0x00 when the end address 0x7E has been reached, as indicated by A2 in FIG. 12.

When processing the pixels of the next line after the read pointer has been returned to the head address 0x00, as indicated by A1 and A2 in FIG. 12, it is desirable to clear the signal level of the control signal to the L level (first signal level in a broad sense).

Figure 15:
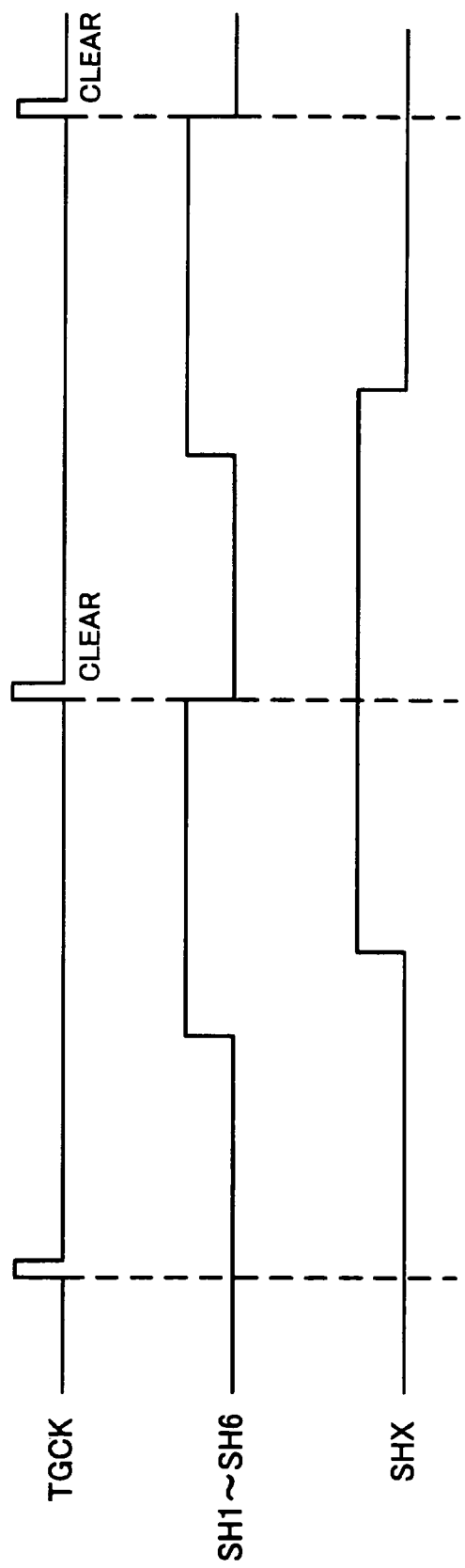
FIG. 15 is a view illustrative of a control signal clear process.

In FIG. 15, the pixels of the first line of the line image sensor are processed when the trigger signal TGCK has become active, and the signal levels of the shift signals SH1 to SH6 are changed using the method according to this embodiment, for example. When the read pointer has been returned to the head address 0x00, as indicated by A1 and A2 in FIG. 12, and the trigger signal TGCK has again become active so that processing of the pixels of the next line has started, the shift signals SH1 to SH6 are cleared to the L level.

For example, when the change event occurrence information stored in the event information memory 90 is the toggle indication information (toggle indication bit) described with reference to FIG. 12, incorrect shift signals SH1 to SH6 may be generated if the signal level clear process shown in FIG. 15 is not performed. Suppose that the signal levels of the signals SH1 to SH6 are erroneously toggled due to noise or the like. In this case, the signals SH1 to SH6 which should change from the L level to the H level every line, as shown in FIG. 15, change from the H level to the L level every line after a toggle error has occurred.

A change in the signals SH1 to SH6 immediately returns to a normal state, even if a toggle error has occurred, by performing the signal level clear process shown in FIG. 15, so that the reliability of the signal generation process can be increased.

Note that the signal SHX is not cleared, differing from the signals SH1 to SH6. A change in signal level across two lines shown in FIG. 15 can be implemented using the signal SHX, so that the degree of variety of the control signals to be generated can be increased.

9. Generation of Clock Control Signal

In this embodiment, the event information memory 90 stores the change event occurrence information relating to the clock control signal SNCKCTL which controls the output state (output pattern) of the drive clock signal of the image sensor, as shown in FIG. 12. The control signal output circuit 70 generates the clock control signal SNCKCTL based on the change event occurrence information read from the event information memory 90. The control signal output circuit 70 controls the output state of the drive clock signal based on the generated clock control signal SNCKCTL.

For example, the control signal output circuit 70 generates drive clock signals SNCK1A to SNCK4 (hereinafter appropriately referred to as "drive clock signal SNCK") of the image sensor using a pattern memory shown in FIG. 16.

In FIG. 16, an internal state value is incremented from 0 to 15, and the internal state value is also incremented from 0 to 15 in the next cycle, for example. A period in which the internal state value is incremented from 0 to 15 is a period of one pixel. Specifically, the internal state value is also incremented from 0 to 15 in a period in which the pixel count value shown in FIG. 14 is incremented by one.

Figure 17:
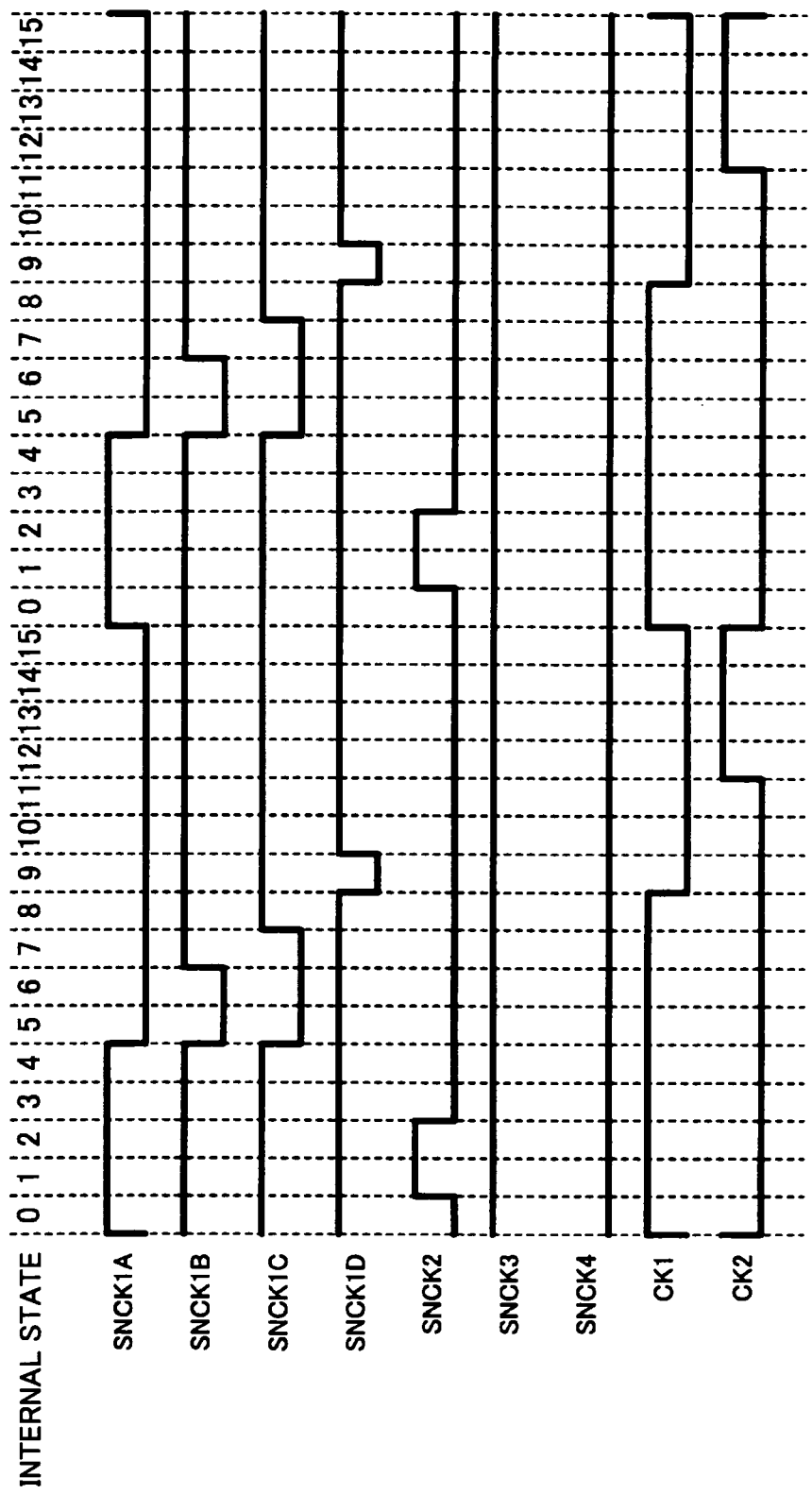
FIG. 17 shows an example of a signal waveform generated using the pattern memory shown in FIG. 16.

In FIG. 16, clock signal pattern information relating to the drive clock signal is read from each address of the drive clock signal pattern memory each time the internal state value is incremented, and the drive clock signal SNCK is generated based on the clock signal pattern information read from the pattern memory. FIG. 17 shows a signal waveform example of the drive clock signal SNCK $\phi 1$ and $\phi 2$ and the like shown in FIG. 1A) generated using the pattern memory shown in FIG. 16.

The clock control signal SNCKCTL controls the output state of the drive clock signal SNCK generated in this manner.

As shown in FIG. 12, the signal SNCKCTL is set at "01" (first state in a broad sense) at the address 0x04 where the pixel number (PIXNUM) is set at 0x00002, for example. As shown in FIG. 13, "01" means an output pattern 1 (during effective pixel output). Therefore, when the signal SNCKCTL is set at "01" (first state), the drive clock signal SNCK with a clock signal pattern of the output pattern 1 is output from the control signal output circuit 70, as indicated by B5 in FIG. 14. Specifically, the output pattern 1 effective pixel (including a black reference pixel) drive clock signal SNCK shown in FIGS. 16 and 17 is generated and output. Likewise, since the signal SNCKCTL is set at "01" at the address 0x0A where the pixel number is set at 0x00005, the drive clock signal SNCK with a normal-state clock signal pattern is output from the control signal output circuit 70, as indicated by B6 in FIG. 14.

The signal SNCKCTL is set at "10" (second state in a broad sense) at the address 0x06 where the pixel number is set at 0x00003. As shown in FIG. 13, "10" means a output pattern 2. Therefore, when the signal SNCKCTL is set at "10" (second state), the drive clock signal SNCK with a clock signal pattern of the output pattern 2 is output, as indicated by B7 in FIG. 14. In this manner, the present embodiment can output two patterns (a plurality of patterns) of clock signal.

The signal SNCKCTL is set at "11" (third state in a broad sense) at the address 0x10 where the pixel number is set at 0x00008. As shown in FIG. 13, "11" means a fixed value output (fixed value output switching). Therefore, when the signal SNCKCTL is set at "11" (third state), the drive clock signal SNCK set at a fixed value level LV1 is output, as indicated by B8 in FIG. 14.

The signal SNCKCTL is also set at "11" at the address 0x12 where the pixel number is set at 0x00009. Therefore, the drive clock signal SNCK set at a fixed value level LV2 is output, as indicated by B9 in FIG. 14. Specifically, the fixed value level of the drive clock signal SNCK changes from LV1 to LV2. The voltage levels of the fixed value levels LV1 and LV2 can be set at arbitrary levels using a register or the like.

The drive clock signal SNCK can be set at an arbitrary DC level in an arbitrary period when driving the image sensor by setting the drive clock signal SNCK at the fixed value level, whereby the image sensor can be appropriately driven.

The drive clock signal with various output patterns which differ depending on the image sensor can be efficiently generated and output using a simple and small circuit configuration by generating the above-described clock control signal SNCKCTL and controlling the output state of the drive clock signal SNCK.

10. Generation of Black Reference Pixel/White Pixel Indication Signal

In this embodiment, the event information memory 90 stores the change event occurrence information relating to a black reference pixel indication signal OBPIX and a white pixel indication signal WHPIX, as shown in FIG. 12. The control signal output circuit 70 generates the black reference pixel indication signal OBPIX and the white pixel indication signal WHPIX based on the change event occurrence information read from the event information memory 90, and outputs the generated signals.

As shown in FIG. 12, the black reference pixel indication signal OBPIX is set at "1" at the address 0x04 where the pixel number is set at 0x00002, for example. When the signal OBPIX is set at "01", the pixel position is specified at the position of the black reference pixel, as indicated by B5 in FIG. 14.

The white pixel indication signal WHPIX is set at "1" at the address 0x0A where the pixel number is set at 0x00005. When the signal WHPIX is set at "01", the pixel position is specified at the position of the white pixel (effective pixel), as indicated by B6 in FIG. 14.

Figure 18A:
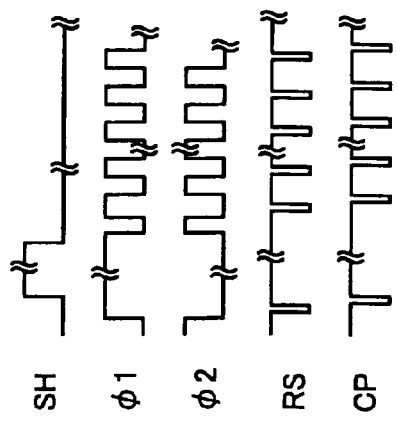
FIGS. 18A and 18B show signal waveform examples of a drive clock signal and an output image signal supplied to an image sensor.
Figure 18B:
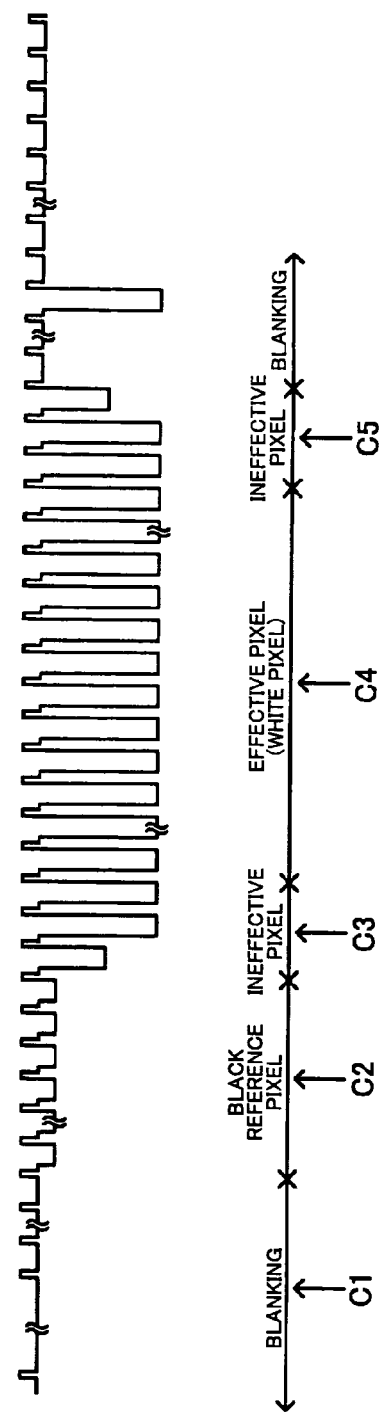

FIGS. 18A and 18B schematically show the signal waveforms of the drive clock signal (e.g., $\phi 1$ and $\phi 2$) supplied to the image sensor and an output image signal.

A blanking period occurs, as indicated by C1 in FIG. 18B. An image signal of the black reference pixel (optical black or optical shield output) is then output, as indicated by C2. An image signal of the ineffective pixel is then output, as indicated by C3. An image signal of the white pixel (effective pixel) is then output, as indicated by C4. An image signal of the ineffective pixel is then output, as indicated by C5.

Therefore, the image sensor can be efficiently driven by specifying the black reference pixel position indicated by C2 in FIG. 18B and the white pixel position indicated by C4 using the black reference pixel indication signal OBPIX and the white pixel indication signal WHPIX.

The drive clock signal SNCK ($\phi 1$ and $\phi 2$) with the clock signal pattern of the output pattern 1 described with reference to B5 and B6 in FIG. 14 is supplied for the black reference pixel and the white pixel indicated by C2 and C4 in FIG. 18B, and the drive clock signal SNCK with the clock signal pattern of the output pattern 2 described with reference to B7 in FIG. 14 is supplied for the ineffective pixel indicated by C3 and C5 in FIG. 18B to drive the image sensor efficiently.

11. Control Signal Output Circuit

Figure 19:
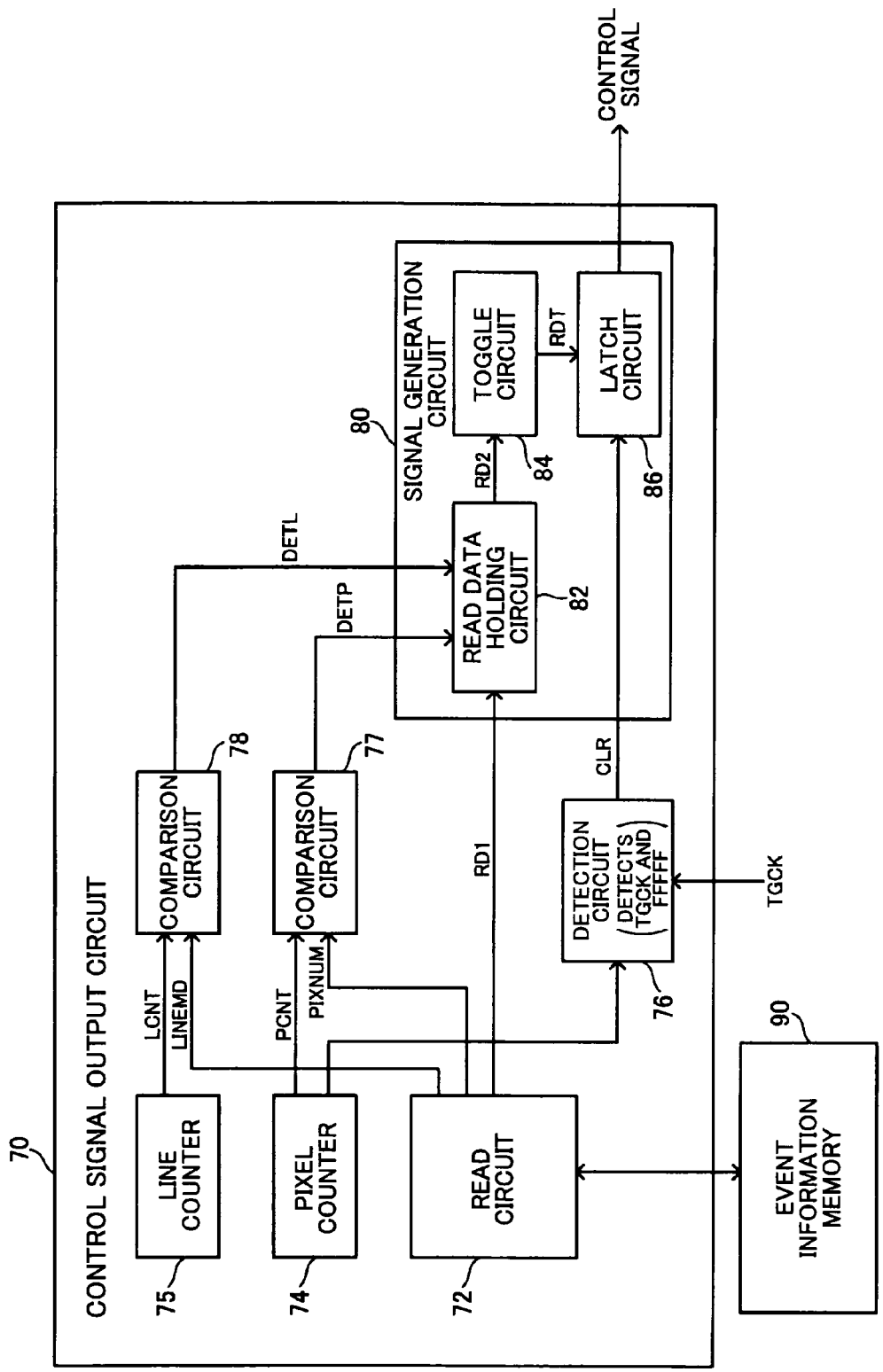
FIG. 19 shows a configuration example of a control signal output circuit.

FIG. 19 shows a specific configuration example of the control signal output circuit 70. The control signal generation circuit 70 includes a read circuit 72, a pixel counter 74, a line counter 75, a detection circuit 76, comparison circuits 77 and 78, and a signal generation circuit 80. The signal generation circuit 80 includes a read data holding circuit 82, a toggle circuit 84, and a latch circuit 86. The control signal generation circuit 70 is not limited to the configuration shown in FIG. 19. Various modifications and variations may be made such as omitting some elements (e.g., line counter and comparison circuit 78) or adding other elements.

In FIG. 19, the read circuit 72 reads the pixel number and the change event occurrence information from the event information memory 90. The pixel counter 74 counts the pixel count value (see FIG. 14). The line counter 75 counts the line count value.

The comparison circuit 77 compares the pixel number PIXNUM read from the event information memory 90 through the read circuit 72 with a pixel count value PCNT outputs from the image counter 74. When the pixel number PIXNUM coincides with the pixel count value PCNT, the comparison circuit 77 outputs a coincidence detection signal DETP.

The comparison circuit 78 compares the line number LINEMD read from the event information memory 90 with a line count value LCNT output from the line counter 75. When the line number LINEMD coincides with the line count value LCNT, the comparison circuit 78 outputs a coincidence detection signal DETL.

When the pixel number PIXNUM coincides with the pixel count value PCNT and the coincidence detection signal DETP has become active, the signal generation circuit 80 generates the control signal based on the change event occurrence information stored at the address of the pixel number which coincides with the pixel count value PCNT.

Specifically, data RD1 (change event occurrence information) read from the event information memory 90 by the read circuit 72 is held by the read data holding circuit 82 at a timing when the coincidence detection signal DETP (or DETL) from the comparison circuit 77 has become active. The toggle circuit 84 toggles the control signal of which the signal level is held by the latch circuit 86 based on output data RD2 from the read data holding circuit 82. This makes it possible to generate the control signals SH1 to SH6, SHX, and the like shown in FIG. 14.

The detection circuit 76 detects the trigger signal TGCK, the finish indication information (0xFFFFFF) described with reference to FIG. 12, and the like to generate the clear signal CLR described with reference to FIG. 15. When the clear signal CLR has become active, the control signal is cleared to the L level, for example.

12. Analog Processing Circuit

Figure 20:
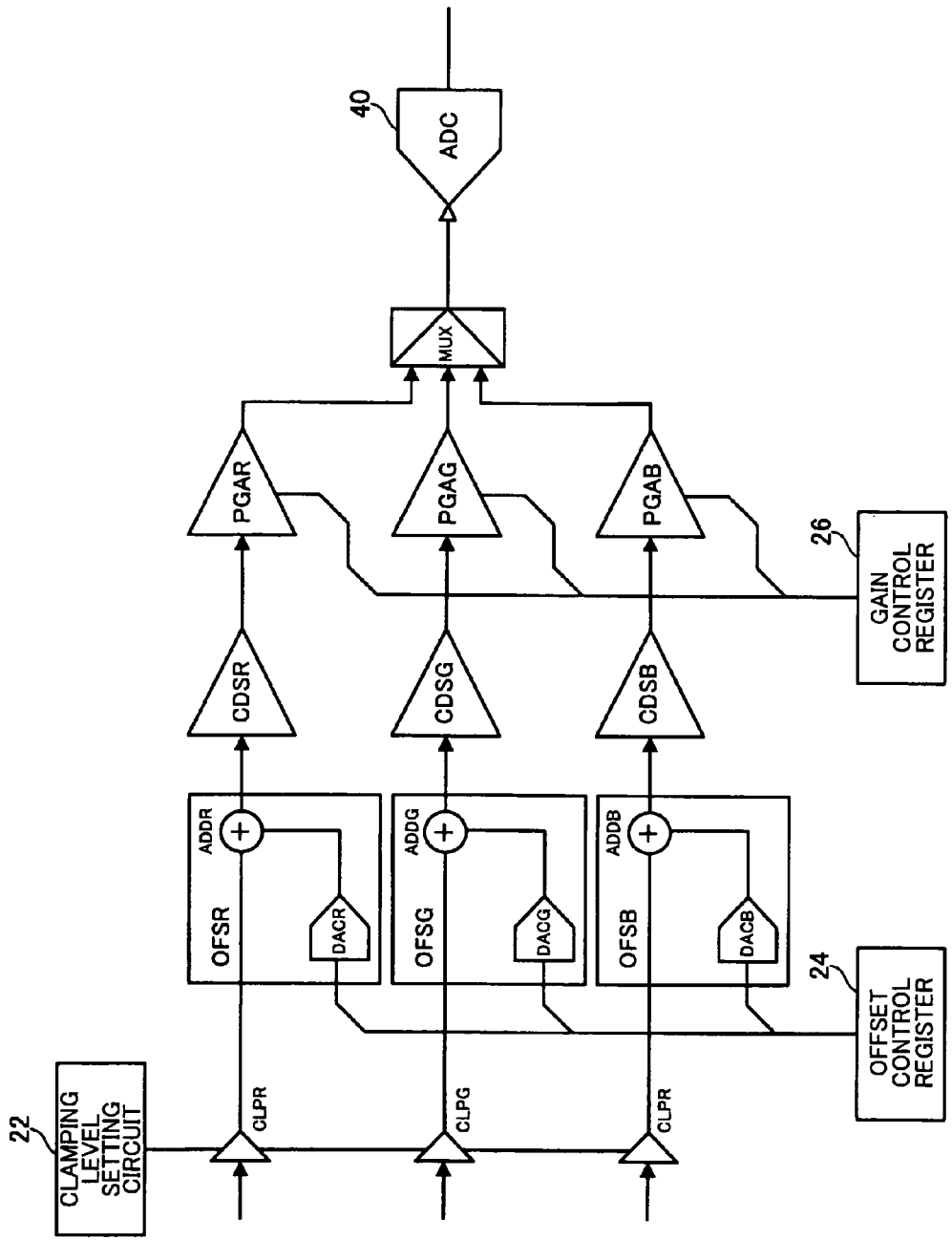
FIG. 20 shows a configuration example of an analog processing circuit.

FIG. 20 shows a configuration example of the analog processing circuit 20. The analog processing circuit 20 is not limited to the configuration shown in FIG. 20. Various modifications and variations may be made such as omitting some elements.

The analog processing circuit 20 includes R, G, and B clamping circuits CLPR, CLPG, and CLPB. The clamping circuits CLPR, CLPG, and CLPB clamp the levels of R, G, and B image signals at clamping levels set by a clamping level setting circuit 22.

The analog processing circuit 20 also includes R, G, and B offset adjustment circuits OFSR, OFSG, and OFSB. The offset adjustment circuits OFSR, OFSG, and OFSB respectively include R, G, and B D/A converters DACR, DACG, and DACB and analog adder circuits ADDR, ADDG, and ADDB. The offset adjustment circuits OFSR, OFSG, and OFSB adjust an offset based on offset adjustment data set in an offset adjustment register 24.

The analog processing circuit 20 also includes R, G, and B correlated double sampling circuits CDSR, CDSG, and CDSB. The analog processing circuit 20 also includes R, G, and B gain control amplifiers PGAR, PGAG, and PGAB. The gain control amplifiers PGAR, PGAG, and PGAB perform gain control based on gain control data set in a gain control register 26.

The analog processing circuit 20 also includes a multiplexer MUX. The R, G, and B image signals can be A/D-converted by time division using the high-speed A/D converter 40 by providing the multiplexer MUX.

13. Electronic Instrument

Figure 21:
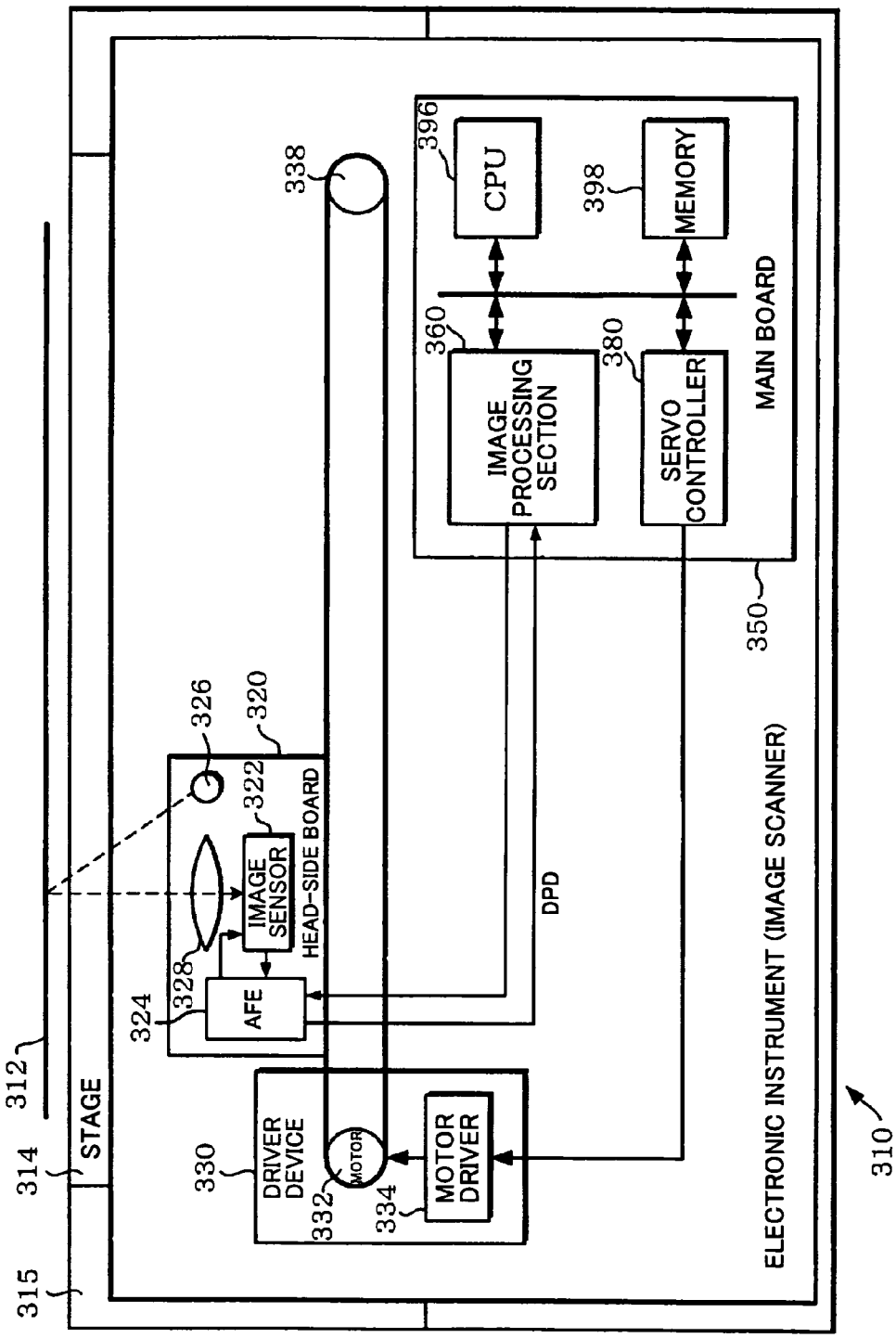
FIG. 21 is a configuration example of an electronic instrument.

FIG. 21 shows a configuration example of an electronic instrument 310 including an analog front-end circuit (AFE) 324 according to one embodiment of the invention. The electronic instrument 310 need not necessarily include all the elements shown in FIG. 21. Various modifications and variations may be made such as omitting some elements.

The electronic instrument 310 (e.g., flatbed image scanner) includes a stage 314 on which an object 312 (e.g., document) is placed, and a frame 315 (e.g., support member or housing) which supports the stage 314. The rectangular stage 314 is formed of an optically transparent material such as glass. The object 312 is placed on the upper portion of the optically transparent stage 314, for example.

The electronic instrument 310 includes a head-side board (carriage) 320 provided with an image sensor 322 and the analog front-end circuit 324. As the image sensor 322, a charge coupled device (CCD), a contact image sensor (CIS), a bucket brigade device (BBD) or the like may be used. The head-side board 320 is also provided with a light source 326 which illuminates the object 312 (document), and an optical system (optical head) such as a lens 328 (condensing section) which focuses light emitted from the light source 326 and reflected by the object 312 on the image sensor 322.

The electronic instrument 310 includes a driver device 330 (drive mechanism) which moves the head-side board 320. The driver device 330 includes a motor 332 (power source) and a motor driver 334 which drives the motor 332. The image sensor 322 is disposed so that the longitudinal direction coincides with the main scan direction. A drive belt which is supported by a pulley 338 on the other end is driven by the motor 332 so that the head-side board 320 secured on the drive belt moves in the sub-scan direction (direction perpendicular to the main scan direction). The method of moving the head-side board 320 may be modified in various ways.

The electronic instrument 310 includes a main board 350. The main board 350 controls each block of the electronic instrument 310. Specifically, the main board 350 controls an image data acquisition process, a servomechanism of the head-side board 320, the analog front-end circuit 324, and the like.

The main board 350 includes an image processing section 360. The image processing section 360 processes image data acquired by the analog front-end circuit 324. The main board 50 includes a servo controller 380. The servo controller 380 performs servo control (feedback control) of the driver device 330 (motor 32) which drives (moves) the head-side board 320. The main board 350 includes a CPU 396 (processor) and a memory 398 (ROM and RAM). The CPU 396 controls the entire main board 350, and exchanges information with the outside. The memory 398 stores a program and various types of data, and functions as a work area for the image processing section 360, the servo controller 380, and the CPU 396.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The configurations and the operations of the analog front-end circuit and the electronic instrument are not limited to those described in the above embodiments. Various modifications and variations may be made.

What is claimed is:

1. An analog front-end circuit comprising:
an analog processing circuit that receives an input image signal from an image sensor, performs a given process on the input image signal, and outputs an image signal;
an A/D converter that A/D-converts the image signal input from the analog processing circuit and outputs an A/D converted value;
a target register, a lower limit target value of an input range of the image signal input from the analog processing circuit to the A/D converter being set in the target register; and
a calculation circuit that monitors the A/D-converted value output from the A/D converter and performs a calculation process,
the analog processing circuit including an offset control circuit that includes an offset control register and performs offset control on the input image signal to output the image signal based on an offset control value set in the offset control register; and
the calculation circuit monitoring the A/D-converted value in a lower limit value output period when the A/D-converted value corresponding to a lower limit value of the input range is output from the A/D converter, and performing an offset setting process that sets the offset control value in the offset control register, the offset control value causing the A/D-converted value to become closer to the lower limit target value set in the target register,
the calculation circuit specifying the lower limit value output period based on an indication signal that designates the lower limit value output period and monitoring the A/D-converted value in the lower limit value output period specified by the indication signal.

2. The analog front-end circuit as defined in claim 1, the calculation circuit performing a comparison process, a bit determination process, and a decrement process until m becomes 0 from n (n≧m≧0; n and m are integer numbers), the comparison process setting 1 in bit m−1 of the offset control value set in the offset control register that has an n-bit width and comparing the A/D-converted value with the lower limit target value, the bit determination process determining a logic level of the bit m−1 of the offset control value to be 1 when the A/D-converted value is smaller than the lower limit target value and determining the logic level of the bit m−1 of the offset control value to be 0 when the A/D-converted value is larger than the lower limit target value, and the decrement process decrementing m by one.

3. The analog front-end circuit as defined in claim 2, the calculation circuit again monitoring the A/D-converted value output from the A/D converter after m has become 0 and the logic levels of all bits of the offset control value set in the offset control register have been determined, and adding 1 to the offset control value set in the offset control register when the A/D-converted value that has been monitored is less than the lower limit target value.

4. The analog front-end circuit as defined in claim 2, the calculation circuit including an averaging circuit that averages the A/D-converted values output from the A/D converter, and comparing an average A/D-converted value of a plurality of pixels with the lower limit target value.

5. The analog front-end circuit as defined in claim 1, further including:

a monitor register, a monitor value of the A/D-converted value output from the A/D converter being set in the monitor register; and an external interface that allows external access to the target register and the monitor register.

6. The analog front-end circuit as defined in claim 1, the lower limit value output period being a black reference pixel output period, the A/D-converted value of a black reference pixel of the image sensor being output in the black reference pixel output period.

7. The analog front-end circuit as defined in claim 6, the analog front-end circuit further including a timing generator that generates a plurality of control signals that are supplied to the image sensor, the timing generator outputting a black reference pixel indication signal that designates the black reference pixel output period as a control signal among the plurality of control signals; and the calculation circuit monitoring the A/D-converted value output from the A/D converter when the black reference pixel indication signal has become active, and comparing the A/D-converted value with the lower limit target value.

8. The analog front-end circuit as defined in claim 7, the timing generator including:

an event information memory; and a control signal output circuit that generates the plurality of control signals based on information read from the event information memory, and outputs the plurality of control signals that have been generated;

the event information memory storing a pixel number and change event occurrence information at each address, the change event occurrence information specifying a control signal among the plurality of control signals that undergoes a signal level change event at the pixel number; and the control signal output circuit generating the plurality of control signals based on the pixel number and the change event occurrence information read from the event information memory, and outputting the plurality of control signals that have been generated.

9. The analog front-end circuit as defined in claim 8, the pixel number being allocated to bit 0 to bit L of data stored at each address of the event information memory, and the change event occurrence information being allocated to bit L+1 to bit M (L<M; L and M are natural numbers) of the data stored at each address of the event information memory.

10. The analog front-end circuit as defined in claim 9, first to (M−L)th control signals among the plurality of control signals being respectively allocated to the bit L+1 to the bit M of the event information memory.

11. The analog front-end circuit as defined in claim 8, the control signal output circuit sequentially reading the pixel number and the change event occurrence information in an order from a head address to an end address of the event information memory, and returning a read pointer of the event information memory to the head address before the end address is reached when at least one of the pixel number and the change event occurrence information that have been read is set to finish indication information that indicates that the change event has finished.

12. The analog front-end circuit as defined in claim 1, an upper limit target value of the input range of the image signal input from the analog processing circuit to the A/D converter being set in the target register;

the analog processing circuit including a gain control circuit that includes a gain control register and performs gain control on the input image signal to output the image signal based on a gain control value set in the gain control register; and the calculation circuit monitoring the A/D-converted value in an upper limit value output period when the A/D-converted value corresponding to an upper limit value of the input range is output from the A/D converter, and performing a gain setting process that sets the gain control value in the gain control register, the gain control value causing the A/D-converted value to become closer to the upper limit target value set in the target register.

13. The analog front-end circuit as defined in claim 12, the calculation circuit performing the offset setting process using image signals of pixels in Gth to Hth (G<H; G and H are natural numbers) lines of the image sensor, and then performing the gain setting process using image signals of pixels in Ith to Jth (I<J; I and J are natural numbers) lines of the image sensor.

14. The analog front-end circuit as defined in claim 13, the calculation circuit repeating a setting process that includes the offset setting process and the gain setting process a plurality of times.

15. The analog front-end circuit as defined in claim 13, the calculation circuit performing the offset setting process using the image signals of the pixels in the Gth to Hth lines, omitting the offset setting process and the gain setting process for a line between the Hth line and the Ith line, and then performing the gain setting process using the image signals of the pixels in the Ith to Jth lines.

16. An analog front-end circuit comprising:

an analog processing circuit that receives an input image signal from an image sensor, performs a given process on the input image signal, and outputs an image signal;

an A/D converter that A/D-converts the image signal input from the analog processing circuit and outputs an A/D converted value;

a target register, an upper limit target value of an input range of the image signal input from the analog processing circuit to the A/D converter being set in the target register; and a calculation circuit that monitors the A/D-converted value output from the A/D converter and performs a calculation process, the analog processing circuit including a gain control circuit that includes a gain control register and performs gain control on the input image signal to output the image signal based on a gain control value set in the gain control register; and the calculation circuit monitoring the A/D-converted value in an upper limit value output period when the A/D-converted value corresponding to an upper limit value of the input range is output from the A/D converter, and performing a gain setting process that sets the gain control value in the gain control register, the gain control value causing the A/D-converted value to become closer to the upper limit target value set in the target register, the calculation circuit specifying the upper limit value output period based on an indication signal that designates the upper limit value output period and monitoring the A/D-converted value in the upper limit value output period specified by the indication signal.

17. The analog front-end circuit as defined in claim 16, the calculation circuit performing a comparison process, a bit determination process, and a decrement process until i becomes 0 from j ($j \geq i \geq 0$; i and j are integer numbers, the comparison process, setting 1 in bit $i-1$ ($j \geq i \geq 0$) of the gain control value set in the gain control register that has a j-bit width and comparing the A/D-converted value with the upper limit target value, the bit determination process determining a logic level of the bit $i-1$ of the gain control value to be 1 when the A/D-converted value is smaller than the upper limit target value and determining the logic level of the bit $i-1$ of the gain control value to be 0 when the A/D-converted value is larger than the upper limit target value, and the decrement process decrementing i by one.

18. The analog front-end circuit as defined in claim 17, the calculation circuit again monitoring the A/D-convened value output from the A/D converter after i has become 0 and the logic lewis of all bits of the gain control value set in the gain control register have been determined, and subtracting 1 from the gain control value set in the gain control register when the A/D-converted value that has been monitored is larger than the upper limit target value.

19. The analog front-end circuit as defined in claim 16, the upper limit value output period being a white pixel output period, the A/D-converted value of a white pixel of the image sensor being output in the white pixel output period.

20. An electronic instrument comprising:

the analog front-end circuit as defined in claim 1; and an image sensor.

* * * * *